United States Patent
Suzuki et al.

(10) Patent No.: US 6,522,665 B1
(45) Date of Patent: Feb. 18, 2003

(54) DATA SEQUENCE GENERATOR, TRANSMITTER, INFORMATION DATA DECODER, RECEIVER, TRANSMITTER-RECEIVER, DATA SEQUENCE GENERATING METHOD, INFORMATION DATA DECODING METHOD, AND RECORDING MEDIUM

(75) Inventors: Takashi Suzuki, Yokosuka (JP); Toshio Miki, Yokohama (JP); Toshiro Kawahara, Yokosuka (JP); Nobuhiko Naka, Yokohama (JP)

(73) Assignee: NTT DoCoMo, Inc., Tokyo (JP)

( * ) Notice: Subject to any disclaimer, the term of this patent is extended or adjusted under 35 U.S.C. 154(b) by 0 days.

(21) Appl. No.: 09/269,919

(22) PCT Filed: Jul. 28, 1998

(86) PCT No.: PCT/JP98/03351

§ 371 (c)(1),
(2), (4) Date: Apr. 1, 1999

(87) PCT Pub. No.: WO99/07100

PCT Pub. Date: Feb. 11, 1999

(30) Foreign Application Priority Data

Aug. 1, 1997 (JP) .............................................. 9-207995

(51) Int. Cl.$^7$ .............................. H04J 3/22; H01L 7/00; H03M 13/00
(52) U.S. Cl. ....................... 370/471; 370/514; 375/365; 714/758; 714/776; 714/779; 714/798
(58) Field of Search ................................ 370/216, 465, 370/470, 471, 503, 509, 514, 516, 520; 375/364, 365, 368, 371; 714/746, 752, 758, 774, 775, 776, 779, 798

(56) References Cited

U.S. PATENT DOCUMENTS

| | | | | |
|---|---|---|---|---|
| 3,873,920 A | * | 3/1975 | Apple, Jr. et al. | 325/41 |
| 5,367,544 A | * | 11/1994 | Bruekheimer | 375/116 |
| 5,579,303 A | * | 11/1996 | Kiriyama | 370/17 |
| 5,856,988 A | * | 1/1999 | Kiriyama | 371/41 |
| 5,995,171 A | * | 11/1999 | Enari et al. | 348/845.1 |
| 6,111,924 A | * | 8/2000 | McKinley | 375/354 |

FOREIGN PATENT DOCUMENTS

| JP | 58-165445 A | 9/1983 |
|---|---|---|
| JP | 62-057345 A | 3/1987 |
| JP | 63-214034 A | 9/1988 |

* cited by examiner

*Primary Examiner*—Alpus H. Hsu
(74) *Attorney, Agent, or Firm*—Brinks Hofer Gilson & Lione

(57) ABSTRACT

The probability of frame destruction is lowered while suppressing the redundancy of the transmission data. On the transmitting side, a predetermined unique word is contained in a frame n for storing the n-th data, and header information n, frame length information and header information n−1 of the frame n−1 one frame before the frame n are subjected to error-correcting coding, contained in the frame n, and transmitted. On the receiving side, the header of the frame n is received. When the frame length information is transmitted with error, the timing is specified by detecting the unique word and header information in the next frame n+1. When the header of the frame n is not successfully decoded, the information data of the frame n is decoded by using the header information n inserted into a predetermined position of the frame n+1.

25 Claims, 28 Drawing Sheets

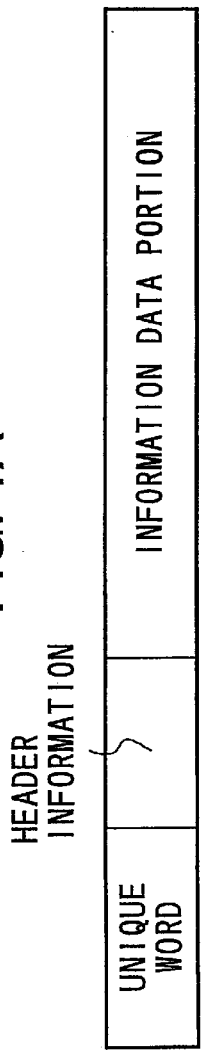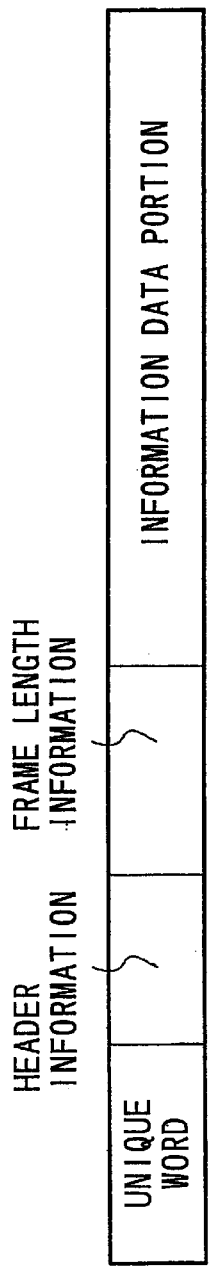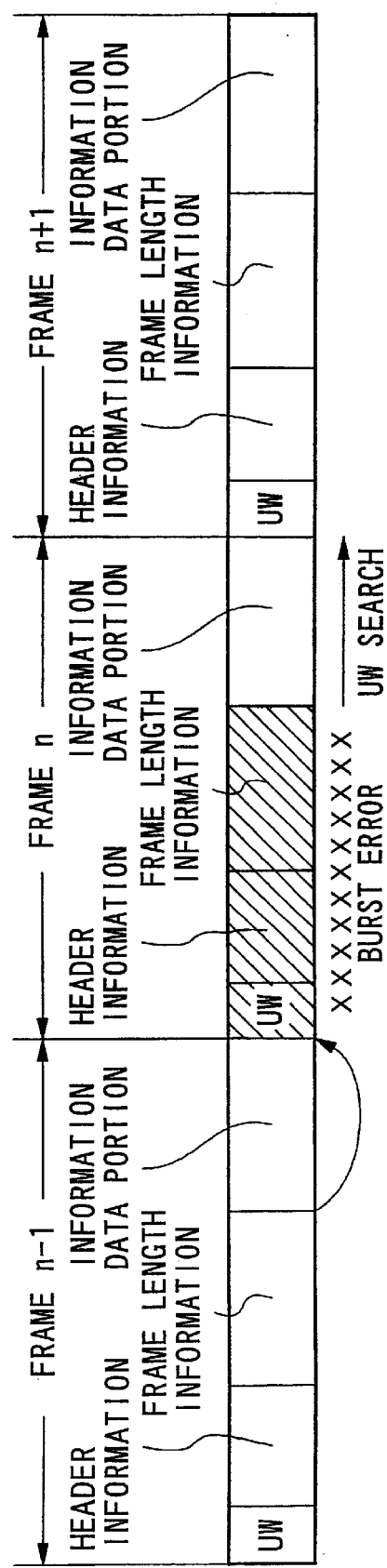

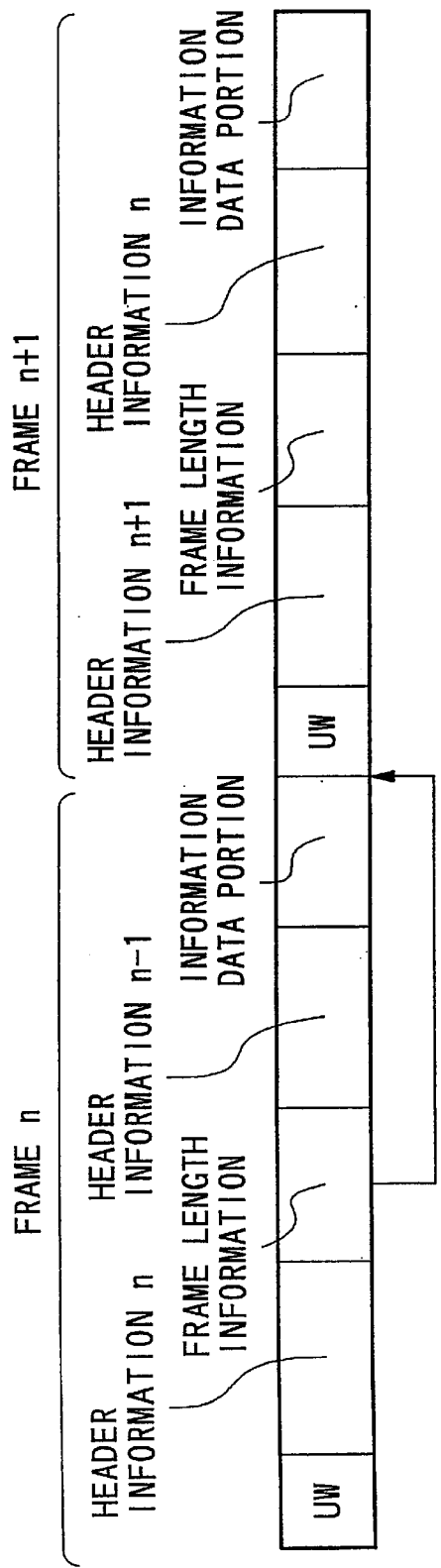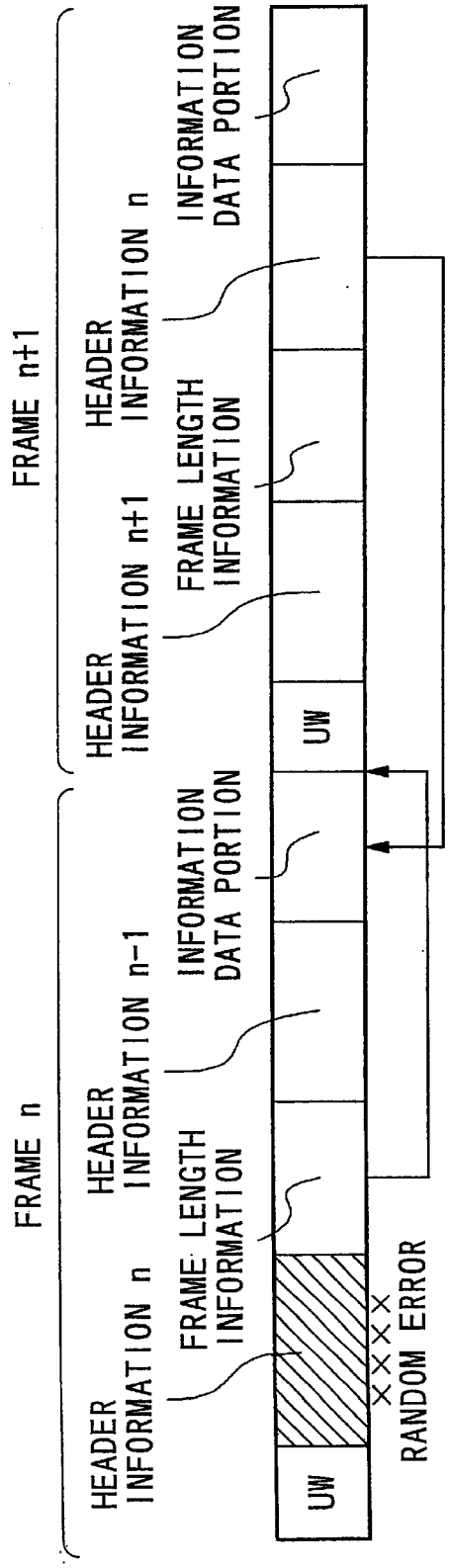

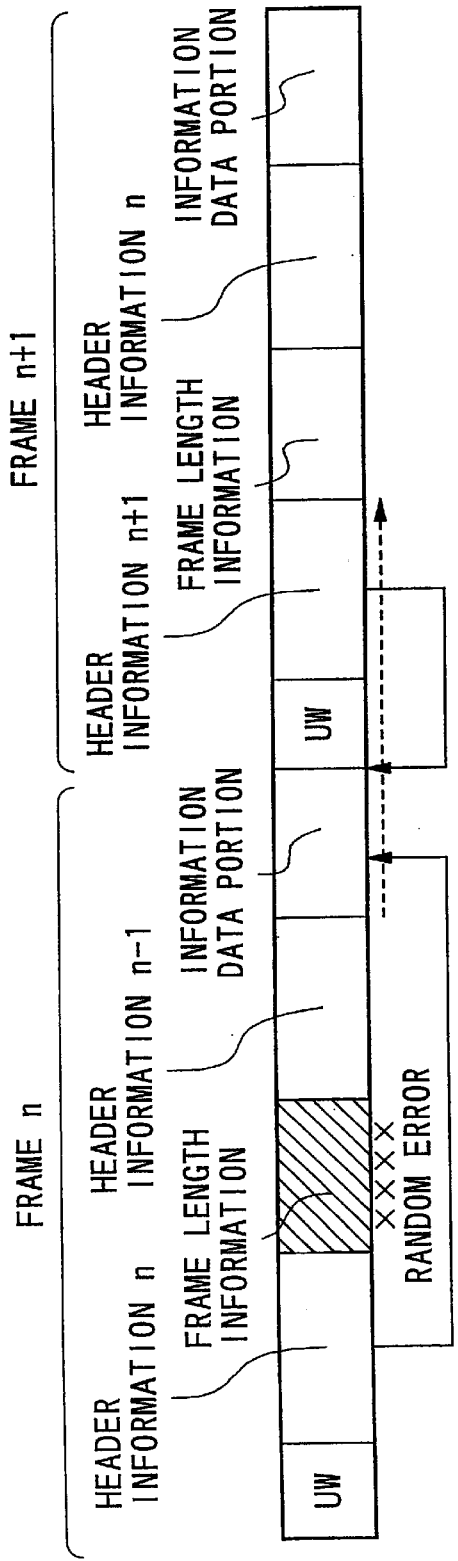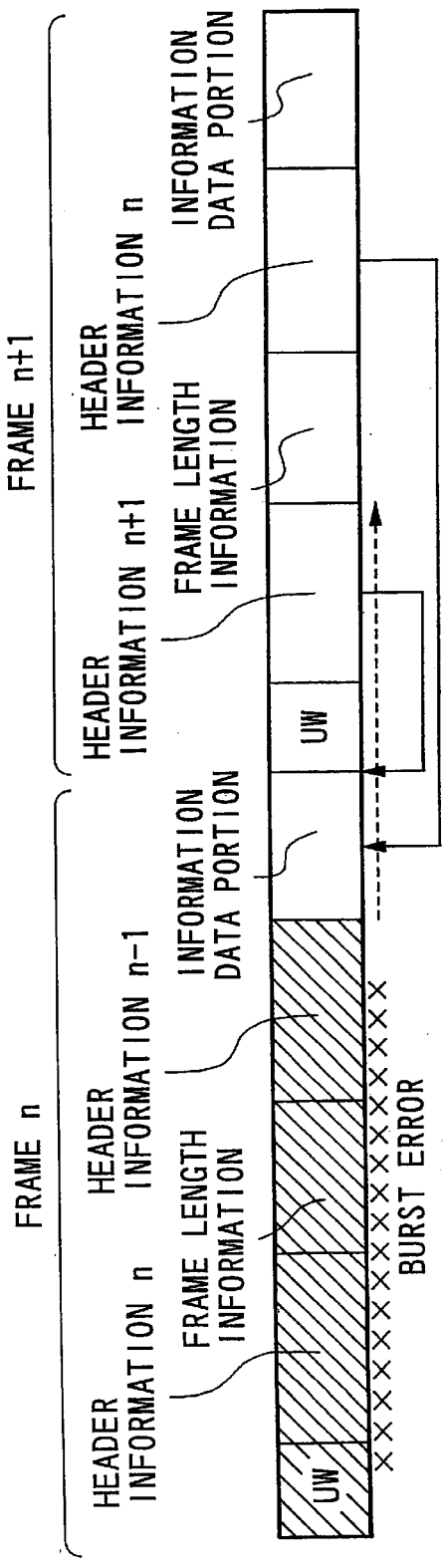

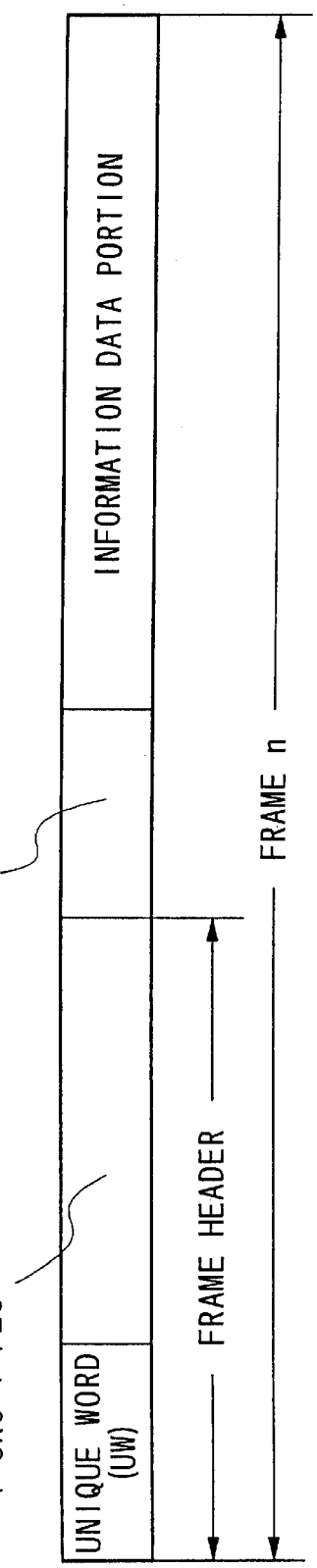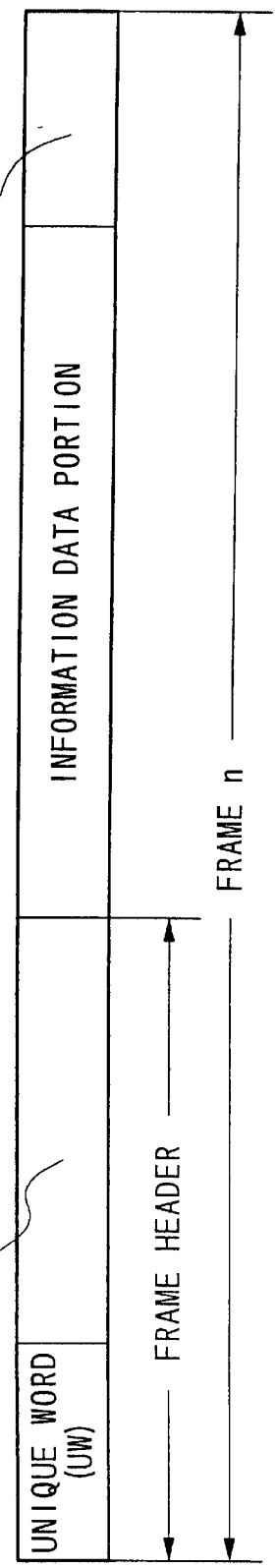

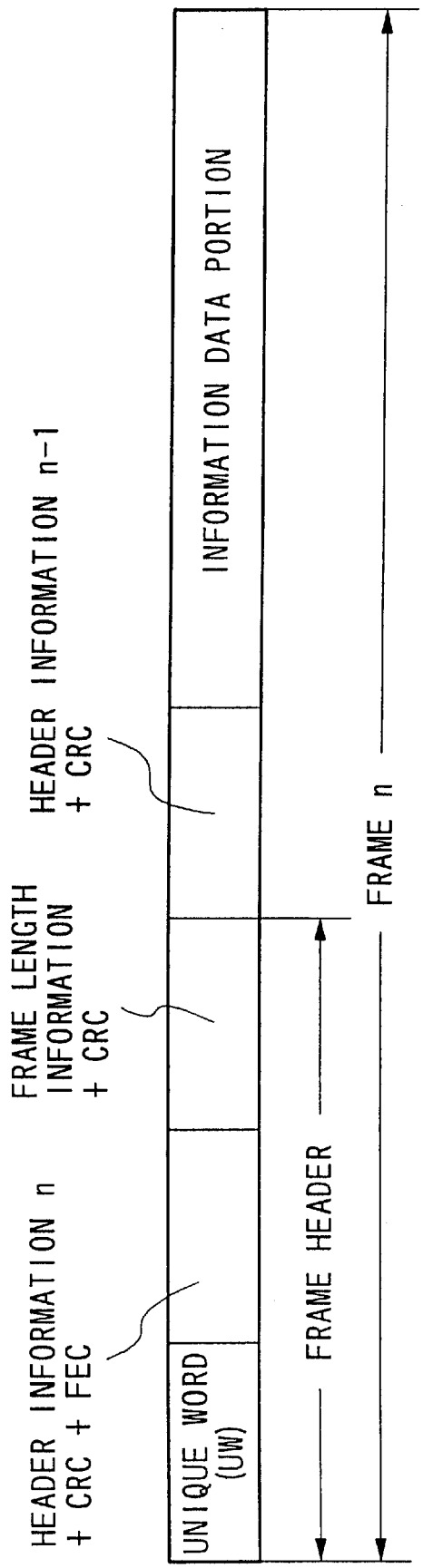

DATA SEQUENCE GENERATOR, TRANSMITTER, INFORMATION DATA DECODER, RECEIVER, TRANSMITTER-RECEIVER, DATA SEQUENCE GENERATING METHOD, INFORMATION DATA DECODING METHOD, AND RECORDING MEDIUM

BACKGROUND OF THE INVENTION

1. Field of the Invention

The present invention relates to a data sequence generator for generating a data sequence suitable for transmission of a data sequence composed of variable length frames having information data of variable length particularly in an environment where a code error is liable to occur, a transmitter using the data sequence generator, an information data decoder for decoding information data from the data sequence, a receiver using the information data decoder, a transmitter-receiver using the data sequence generator and the information data decoder, a data sequence generating method for generating the data sequence, an information data decoding method for extracting information data from the data sequence, and a recording medium recording the data sequence.

2. Description of the Related Art

In case of transmitting a data sequence having a frame structure, detection of the synchronous position of a frame in a received signal sequence, namely, a frame synchronization is very important, and particularly in transmission of a variable length frame, since the synchronous position varies with each frame, a more highly accurate frame synchronization is required. And header information necessary for decoding data (information data) in an information data portion is also as important as the frame synchronization, and protection of the header information from a code error is also required.

As a method for realizing a frame synchronization (frame synchronization method), a method for realizing a frame synchronization by adding a unique word (UW: specific information) such as the M sequence and the like to each frame as a frame synchronization code in a transmitter side, and detecting the unique word from a received signal sequence in a receiver side (hereinafter referred to as a first frame synchronization method) is widely known. The first frame synchronization method does not limit in particular the position where a unique word is to be added, but a variable length data transmission system adopting the synchronization method often adds a unique word usually to the forefront of a frame, as shown in FIG. 1A, in order to simplify the process.

By the way, in the first frame synchronization method, when a unique word and information data in a frame coincide with each other in a unique word detecting process, an "erroneous synchronization" occurs which is a phenomenon in which an erroneous position results in being adopted as a frame-synchronous position. And in a unique word detecting process, when the unique word in a frame contains an error which has occurred on a transmission channel (communication channel), a "non-detection" occurs which is a phenomenon in which the unique word cannot be detected from the frame and the synchronous position cannot be determined. Both the above-mentioned phenomena each are a frame synchronization error of a kind, and when such a frame synchronization error occurs, the receiver side cannot decode the whole frame for which a correct synchronous position has not been obtained and the frame comes to be discarded. Since the discard of a frame brings about a great reduction in data transfer rate, it is desired to reduce the frame synchronization error rate in the first frame synchronization method. Particularly, since the probability of occurrence of a code error is very high in a radio transmission channel and the like, it is desirable to adopting a frame synchronization method more robust against error.

Up to now, as a method for reducing the probability of occurrence of an erroneous synchronization (hereinafter referred to as a synchronization error rate), a method of using the result of error detection of header information is known. In a frame synchronization method adopting this method (hereinafter referred to as a second frame synchronization method), when a unique word is detected in a receiver side, then an error detection decoding process of header information is performed and if the header information does not have an error, a position where the unique word has been detected is determined as a synchronous position. That is to say, since the system fails in detection of header information even if a unique word and information data in a frame coincide with each other, it is possible to avoid an erroneous synchronization which has occurred in such a case. However, in an environment where a burst error occurs (burst error environment), the probability of occurrence of non-detection cannot be reduced even by using the second frame synchronization method. The reason is that it is impossible to detect a synchronous position in case that the unique word and header information in a frame are contained in a burst error section.

As a frame synchronization method for realizing a high-accuracy frame synchronization even in a burst error environment, there is a method which disposes frame length information in a frame as shown in FIG. 1B and detects a frame synchronization using this frame length information (hereinafter referred to as a third frame synchronization method). Since the frame length information coincides with the length from the position of the unique word of the frame to the position of the unique word of the next frame, according to the third frame synchronization method, it is possible to know in advance the position of the unique word in the next frame using the frame length information and reduce the probability of non-detection and erroneous detection of a unique word.

In the third frame synchronization method using frame length information, since the length of a frame n−1 is determined if the header information and frame length information of the frame n−1 shown in FIG. 2 can be correctly decoded, decoding of the frame n−1 can be started without performing search of the next synchronous position (hereinafter referred to as a synchronization search). And since a synchronization search can be started at the forefront of the next frame, it is possible to reduce the probability of occurrence of an erroneous synchronization which is caused by erroneous detection of a unique word in an information data portion. In case of being not able to decode frame length information due to a burst error which has occurred over the synchronous position indicated by the frame length information in the frame n−1 as shown in the frame n, it is possible to determine a section of the frame n and take out the frame n by searching a unique word from an appropriate position (position where there can be the unique word of the frame n+1) and detecting the unique word of the frame n+1 at a correct position. Therefore, by using jointly this method and the above-mentioned second frame synchronization method using header information (a method of reducing erroneous synchronization), it is possible to realize a high-accuracy frame synchronization even in a burst error environment.

By the way, in a data transmission having a frame structure, a frame to which header information necessary for decoding information data has been added is transmitted in many cases, and in the above-mentioned second frame synchronization method it is assumed that the header information is used. As an example of a data transmission procedure for adding header information, the HDLC (High Level Data Link Control) procedure being generally used in data transmission can be mentioned. In the HDLC procedure, in case that header information cannot be correctly decoded due to a transmission channel error, the whole frame cannot be decoded in the same way as the case that a frame synchronization error has occurred. Therefore, it is necessary to strengthen protection of header information to the same degree as the frame synchronization.

As a method for protecting header information, a method of error-correction-encoding the header information is conceivable. However, in case that an error exceeding the error correcting ability of the header information has occurred in the header information portion in a frame as shown in FIG. 2, even if the header information has been error-correction-encoded, since although a frame-synchronous position can be determined as described above the header information cannot be decoded, the information data cannot be decoded and the frame results in being discarded. That is to say, the whole error resiliency of a frame has been lowered due to difference in error resilience between the frame synchronization and the header information.

In order to improve the whole error resiliency of a frame it is conceivable to apply an error correction code having a high error correction ability, but in a burst error environment a robust error correction ability coping with densely occurring errors becomes necessary and the redundancy of transmission data results in being greatly increased.

And as a method for efficiently protecting data from a burst error, a method which separates the data in point of time and transmits them together with error detection information repeatedly at plural times is effective. This method is described in detail, for example, in "A Very Low Rate Moving Image Encoding Method Having a Robust Error Resiliency (2)—Duplication of Important Information and Reversible Code—, D-244, 1996 General Convention of The Institute of Electronics, Information and Communication Engineers". However, this method requires that the positions of data transmitted separately at plural times have been determined in advance, and it cannot be applied to transmission of such data whose position cannot be determined as the header information in a variable length frame. And in a random error environment having a high code error rate, when an error occurs in any data separately and repeatedly sent at plural times even if those errors are small in number, it is no longer possible to normally receive the data. Although it is of course conceivable to error-correction-code each of the data to be sent separately and repeatedly at plural times, when attempting to obtain a sufficient error correction ability, eventually the redundancy of transmission data becomes great and the transmission efficiency of data is greatly deteriorated in cooperation with the redundancy of sending separately and repeatedly the data at plural times.

As described above, according to a variable length data transmission system adopting a former frame synchronization method, it has been difficult to satisfactorily perform at the same time the synchronization of a variable length frame and the protection of such important information as header information and the like in a transmission channel having a high code error rate.

SUMMARY OF THE INVENTION

An object of the present invention is to provide a data sequence generator and an information data decoder which are capable of satisfactorily performing at the same time establishment of synchronization of variable length frames and protection of header information in a variable length frame as suppressing increase of the redundancy of transmission data in an environment where a burst error and a random code error can occur, a transmitter using the data sequence generator, a receiver using the information data decoder, a transmitter-receiver using the data sequence generator and the information data decoder, a data sequence generating method, an information data decoding method, and a recording medium.

In order to attain the above-mentioned object, a data sequence generator according to the present invention is a data sequence generator for generating a data sequence to be transmitted through a transmission channel by generating according to input of information data a variable length frame having a first storage area storing variable length information data inputted from the outside, a second storage area storing specific information for establishing a frame synchronization, a third storage area storing header information necessary for decoding the information data and establishing the frame synchronization, and a fourth storage area storing frame length information indicating a frame length, the data sequence generator being characterized by comprising a header information error detection encoding means for obtaining header information error-detection-encoded data by applying an error detection encoding process to the header information, a header information storing means for storing the header information error-detection-encoded data into the third storage area corresponding to the header information, and an inserting means for inserting the header information error detection encoding data in an insertion position which is a position to be determined from the timing of the frame synchronization in the data sequence and is separated from the third storage area.

And an information data decoder according to the present invention is an information data decoder for decoding the information data from a data sequence generated by the data sequence generator, the information data decoder being characterized by comprising a first header information error detection decoding means for performing an error detection decoding process on data stored in the third storage area of the variable length frame being under decoding and for outputting a first error detection result and a first decoding result, an insertion position determining means for determining the insertion position corresponding to the information data stored in the first storage area of the variable length frame on the basis of the timing of the frame synchronization of the variable length frame, a second header information error detection decoding means for performing an error detection decoding process on data inserted in the insertion position and for outputting a second error detection result and a second decoding result, a header information selecting means for selecting one decoding result containing no error out of the first decoding result and the second decoding result on the basis of at least one of the first error detection result and the second error detection result, and an information data decoding means for decoding the information data using the decoding result selected by the header information selecting means.

According to the above-mentioned composition, when a frame synchronization is established it is possible to detect plural pieces of header information for a piece of information data. Since these plural pieces of header information are arranged separately from one another, the possibility that an error occurs in every piece of header information is low even if a burst error occurs in a transmission channel. Additionally, since each header information has been error-detection-encoded, the information data decoder can easily determine the header information having no error. That is to say, according to the above-mentioned composition, it is possible to realize establishment of a variable length frame synchronization and protection of header information in a sufficiently high quality without greatly increasing the redundancy even in an environment where a burst error and a random error can occur.

And an error detection process may be performed on frame length information, and in this case it is possible to use together a frame synchronization using frame length and a frame synchronization using specific information and header information. Therefore, a frame synchronization can be established in higher accuracy. Furthermore, since an error detection process is performed on the header information used in establishment of a frame synchronization, it is possible to more improve the accuracy of the frame synchronization. Moreover, if performing an error detection and error correction process on header information to be used in establishment of a frame synchronization and performing only an error detection process on the other header information, it is possible to reduce the probability of occurrence of non-detection in a random error environment as suppressing increase of the redundancy. Of course, an error detection and error correction process may be performed on header information not to be used in establishment of the frame synchronization, or the reliability of frame length information may be improved by performing an error detection process or an error detection and error correction process on the frame length information.

And in order to attain the above-mentioned object, a transmitter, a receiver and a transmitter-receiver according to the present invention are respectively provided with a data sequence generator, an information data decoder, and a data sequence generator and an information data decoder. A communication system provided with at least two out of these transmitter, receiver, and transmitter-receiver can realize establishment of a variable length frame synchronization and protection of header information in a sufficiently high quality as suppressing increase of the redundancy even in an environment where a burst error and a random error can occur.

And a data sequence generating method according to the present invention is a data sequence generating method for generating a data sequence composed of a variable length frame having a first storage area storing variable length information data, a second storage area storing specific information for establishing a frame synchronization, a third storage area storing header information necessary for decoding the information data and establishing the frame synchronization, and a fourth storage area storing frame length information indicating a frame length, the data sequence generating method being characterized by performing for every at least one piece of the information data a storing step of error-detection-encoding the header information corresponding to the information data and storing it into the third storage area corresponding to the information data, and an inserting step of error-detection-encoding the header information and inserting it in a position which is a position to be determined from the timing of the frame synchronization in the data sequence and is separated from the storage area.

And in order to attain the above-mentioned object, an information data decoding method according to the present invention is an information data decoding method for decoding the information data from a data sequence composed of a variable length frame having a first storage area storing variable length information data, a second storage area storing specific information for establishing a frame synchronization, a third storage area storing header information necessary for decoding the information data and establishing the frame synchronization, and a fourth storage area storing frame length information indicating a frame length, the information data decoding method being characterized by performing for every at least one of the variable length frames a first error detection step of error-detection-decoding data stored in the third storage area of the variable length frame being under decoding, a second error detection step of error-detection-decoding data inserted in a position determined from the timing of the frame synchronization, and a decoding step of decoding the information data stored in the first storage area of the variable length frame using one decoding result countering no error out of a decoding result in the first error detection step and a decoding result in the second error detection step.

According to the above-mentioned method, from the same reason as described above, it is possible to realize establishment of a variable length frame synchronization and protection of header information in a sufficiently high quality without greatly increasing the redundancy even in an environment where a burst error and a random error can occur.

And in order to attain the above-mentioned object, a recording medium according to the present invention is a recording medium which records a data sequence composed of a variable length frame having a first storage area storing variable length information data, a second storage area storing specific information for establishing a frame synchronization, a third storage area storing header information necessary for decoding the information data and establishing the frame synchronization, and a fourth storage area storing frame length information indicating a frame length, and is sequentially accessed at a specified speed, wherein the variable length frame has a fifth storage area storing the header information at a position which is a position to be determined from the timing of the frame synchronization in the data sequence and is separated by a distance based on the speed from the third storage area.

In a system composed of this recording medium and a device for accessing the recording medium, from the same reason as described above, it is possible to realize establishment of a variable length frame synchronization and protection of header information in a sufficiently high quality without greatly increasing the redundancy even in an environment where a burst error and a random error can occur.

BRIEF DESCRIPTION OF THE FIGURES

FIGS. 1A and 1B each are a diagram showing a frame structure example in a former frame synchronization method.

FIG. 2 is a diagram for explaining a disadvantage of a former frame synchronization method in a burst error environment.

FIG. 7A is a diagram for explaining a frame decoding procedure in the same system in case that no error has occurred in header information and frame length information in a frame header.

FIG. 7B is a diagram for explaining a frame decoding procedure in the same system in case that an error has occurred only in header information in a frame header.

FIG. 7C is a diagram for explaining a frame decoding procedure in the same system in case that an error has occurred only in frame length information in a frame header.

FIG. 7D is a diagram for explaining a frame decoding procedure in the same system in case that an error has occurred over the whole frame header.

FIG. 13 is a diagram showing a frame structure example of a variable length frame to be transmitted in the same system.

FIG. 14 is a diagram showing a frame structure example of a variable length frame to be transmitted in the same system.

FIG. 15 is a diagram showing the frame structure of a variable length frame to be transmitted in a first variation example of the same system.

PREFERRED EMBODIMENTS OF THE PRESENT INVENTION

Embodiments of the present invention are described with reference to the drawings.

Figure 30:
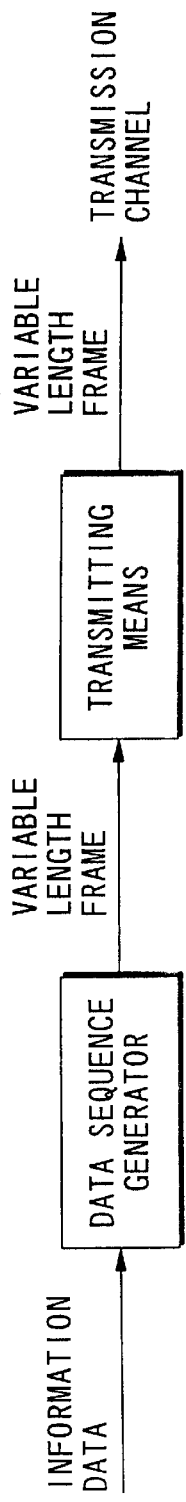
FIG. 30 is a block diagram showing the composition of a transmitter according to each embodiment of the present invention.
Figure 31:
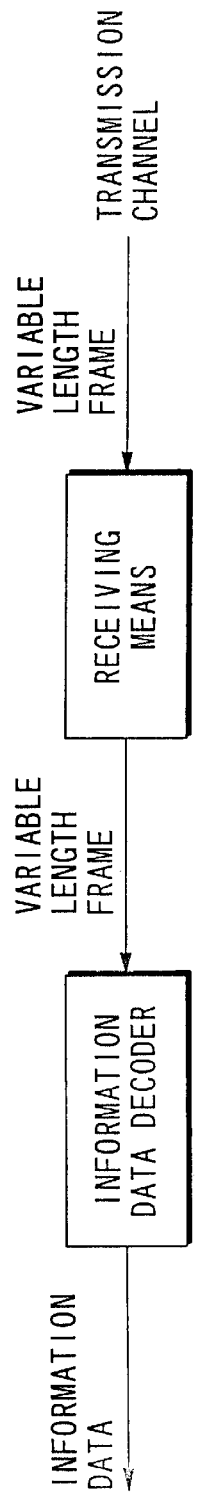
FIG. 31 is a block diagram showing the composition of a receiver according to each embodiment of the present invention.

In each of embodiments described below, as shown in FIG. 30 a transmitter is provided with a data sequence generator for generating a variable length frame corresponding information data inputted from the outside and a transmitting means for transmitting a variable length frame generated by the data sequence generator to a transmission channel, and as shown in FIG. 31 a receiver is provided with a receiving means for receiving a variable length frame transmitted through the transmission channel and an information data decoder for decoding information data contained by the variable length frame received by the receiving means.

A. First Embodiment

A variable length data transmission system having a transmitter and a receiver according to a first embodiment of the present invention is described.

The same system fundamentally, in a data sequence generator inside the transmitter, composes a frame by adding a unique word (UW: specific information), header information and frame length information to information data to be transmitted and distributively arranges the header information in the frame or another frame, and in an information data decoder inside the receiver, establishes a frame synchronization by means of a frame synchronization method using detection of a unique word and error detection of header information and a frame synchronization using frame length information, and decodes the frame information on the basis of the correctly decoded header information out of distributively arranged pieces of header information.

A-1. Composition

Figure 3:
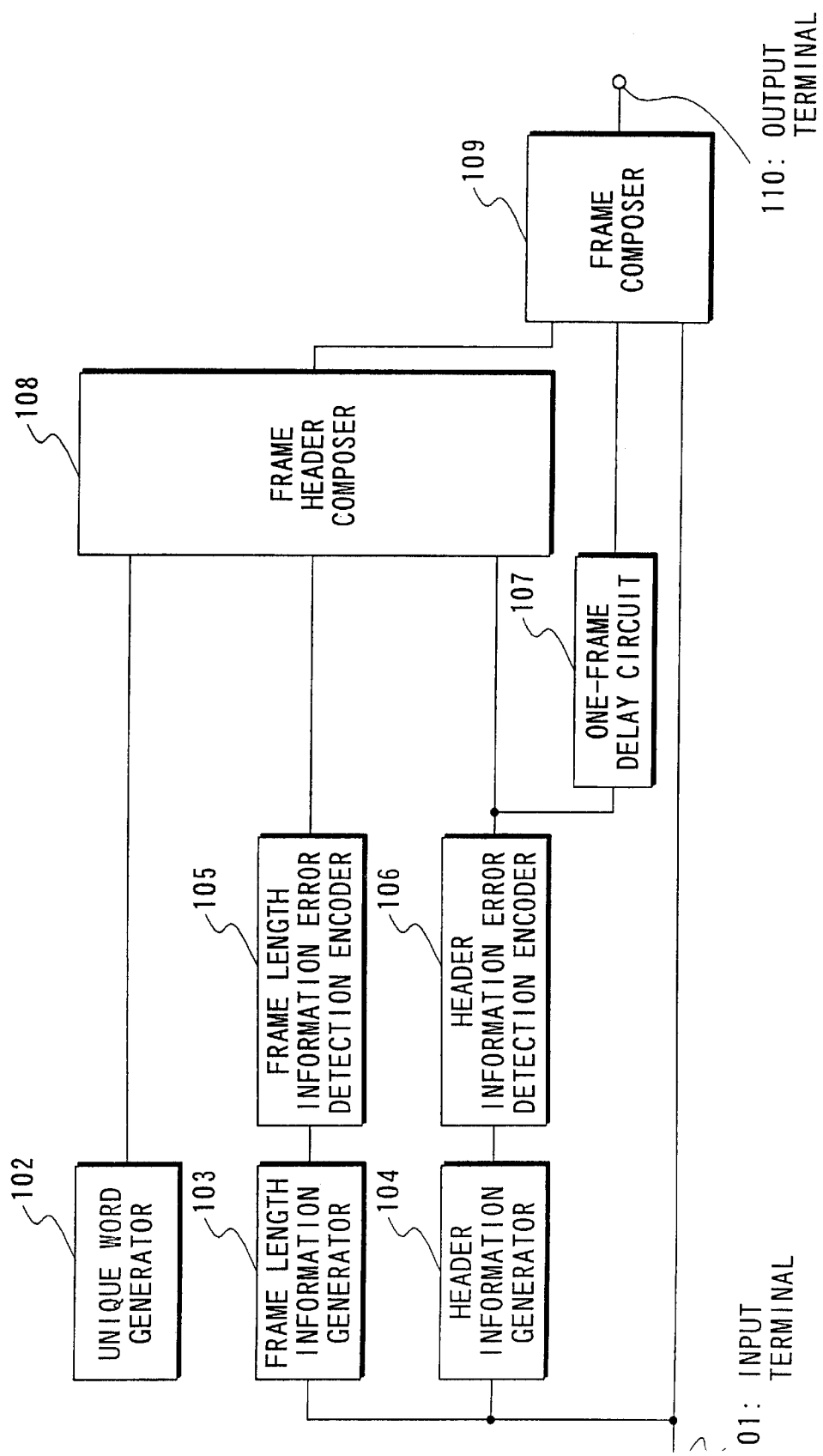
FIG. 3 is a block diagram showing the composition of a data sequence generator in a variable length data transmission system having a transmitter and a receiver according to a first embodiment of the present invention.
Figure 4:
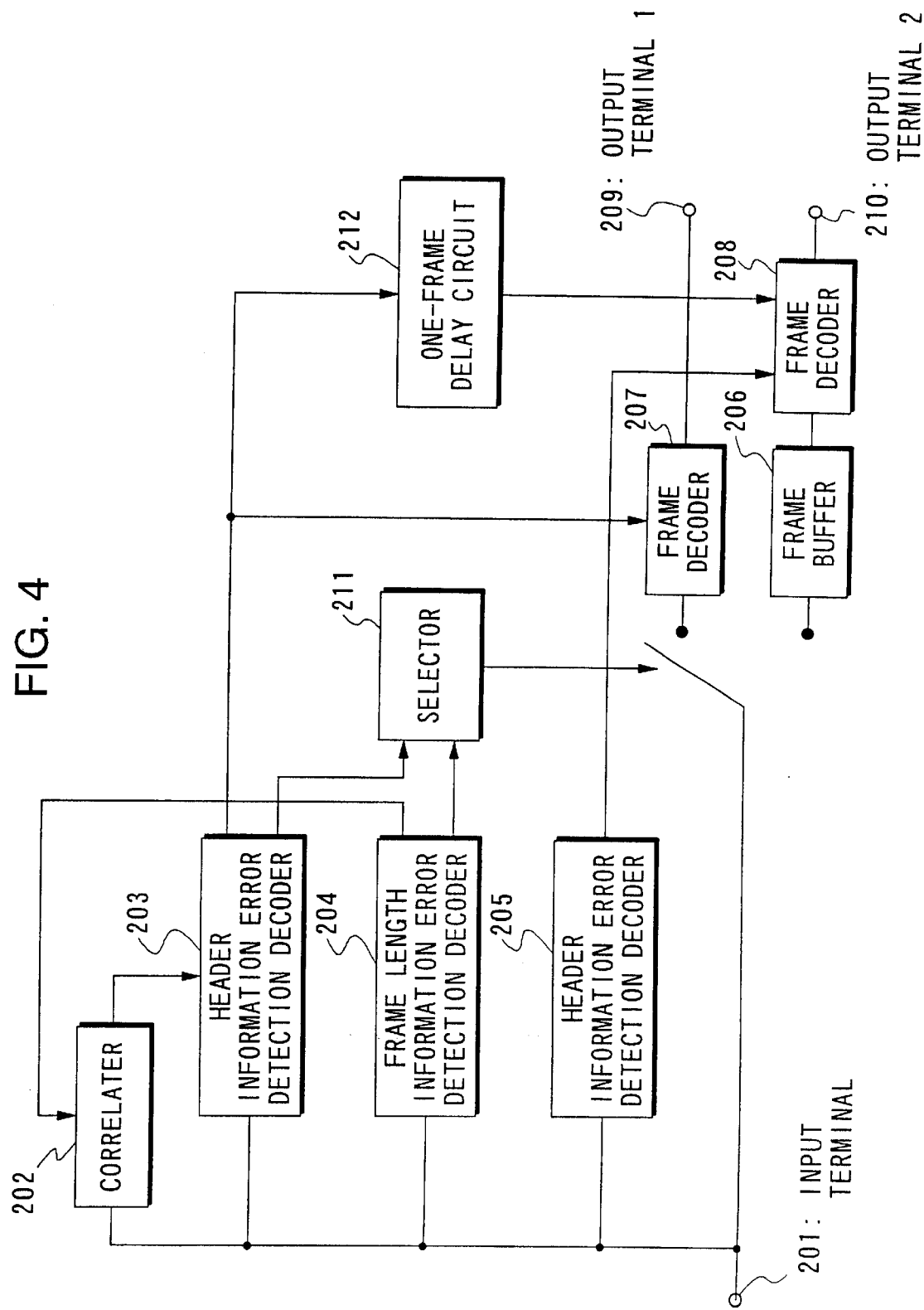
FIG. 4 is a block diagram showing the composition of a information data decoder in the same system.

First, the composition of the same system is described with reference to FIGS. 3 to 6. FIG. 3 is a block diagram showing the composition of a data sequence generator and FIG. 4 is a block diagram showing the composition of an information data decoder. And FIGS. 5 and 6 each are a diagram showing a frame structure example of a variable length frame (frame n: the nth frame) to be transmitted in the same system.

A-1-1. Frame Structure

First, the frame structure of a variable length frame to be transmitted in the same system is described with reference to FIGS. 5 and 6.

Figure 5:
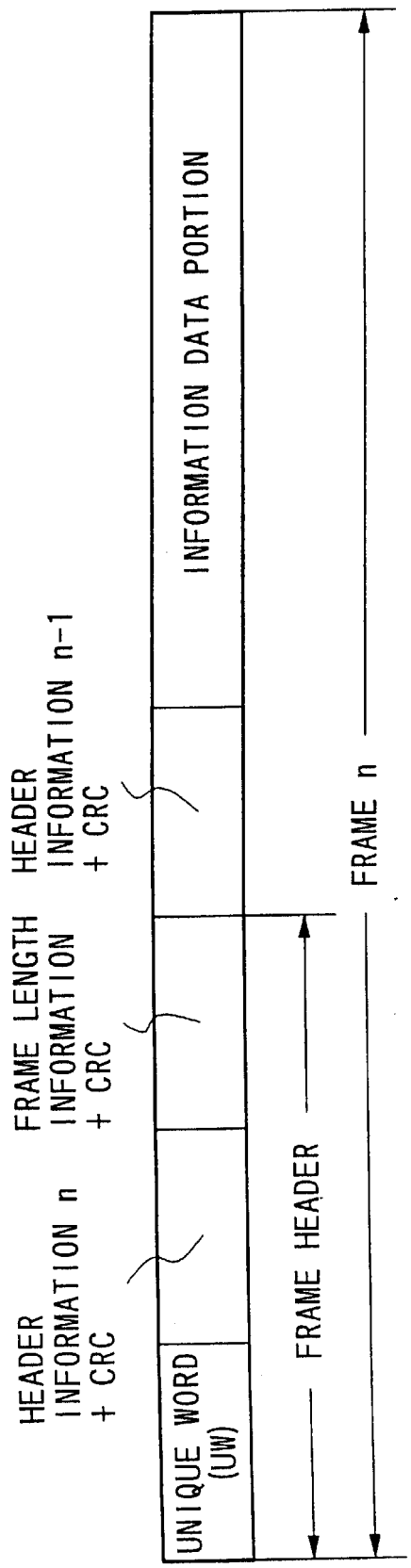
FIG. 5 is a diagram showing a frame structure example of a variable length frame to be transmitted in the same system.

In this embodiment, the number of transmissions of header information for one piece of information data is set as two times, and as shown in FIG. 5, the fixed-length frame header of a frame n contains, in order from the forefront, a unique word (UW) for establishing a frame synchronization, header information n of the frame n, the header information n being error-detection-encoded by means of CRC (Cyclic Redundancy Code), and frame length information of the frame n, the frame length information being error-detection-encoded by means of CRC. And directly after the frame header, header information n–1 of a frame n–1 of one frame before, the header information n–1 being error-detection-encoded by means of CRC and an information data portion storing information data of the frame n follow in consecutive order. The unique word, the header information n, the frame length information and the header information n–1 each are information of fixed length. And as shown in FIG. 6, a frame can be also formed by adding the header information to be used in establishment of a frame synchronization out of two pieces of header information for the same frame into the frame header and adding the header information not to be used in establishment of a frame synchronization to the end of the frame. Moreover, both pieces of header information may be the same information and may be information for different information data. Here, for the purpose of avoiding complication of the description, the description is done on the assumption that this embodiment has the frame structure shown in FIG. 5.

A-1-2. Composition of a Data Sequence Generator and an Information Data Decoder

Next, the composition of a data sequence generator for generating a frame having the above-mentioned structure and the composition of an information data decoder for decoding information data from the frame are described with reference to FIGS. 3 and 4.

First, the composition of the data sequence generator is described. In FIG. 3, 101 is an input terminal for inputting information data to be transmitted, 102 is a unique word generator for generating a unique word, 103 is a frame length information generator for generating frame length information indicating a frame length uniquely determined from the size of the information data, and 104 is a header information generator which is connected with the input terminal 101 and generates header information for decoding the information data.

105 is a frame length information error detection encoder for error-detection-encoding and outputting frame length information generated by the frame length information generator 103, 106 is a header information error detection encoder for error-detection-encoding and outputting header information generated by the header information generator 104, 107 is a one-frame delay circuit for delaying by one frame portion and outputting an output of the header information error detection encoder 106, and 108 is a frame header composer for assembling a frame header and composes a frame header by arranging a unique word generated by the unique word generator 102, an output of the frame length information error detection encoder 105 (error-detection-encoded frame length information) and an output of the header information error detection encoder 106 (error-detection-encoded header information) in this order and outputs the composed frame header. 109 is a frame composer connected with the input terminal 101, and composes a frame by arranging an output of the frame header composer 108, an output of the one-frame delay circuit 107 (header information for a frame of one frame before), and information data from the input terminal 101 in this order and outputs the composed frame. 110 is an output terminal connected with the frame composer 109, and supplies an output (frame) of the frame composer 109 to an unillustrated transmitting means.

Next, the information data decoder is described. In FIG. 4, 201 is an input terminal for inputting a signal sequence (received signal sequence) which is transmitted through a transmission channel and is received by an unillustrated receiving means, 202 is a correlater for obtaining a correlative value between a received signal sequence inputted through the input terminal 201 and a unique word, and 203 is a header information error detection decoder for applying an error detection decoding process to header information contained in a received signal sequence, and in case that a correlative value obtained by the correlater 202 is higher than a predetermined threshold value, it applies the error detection decoding process to a received signal sequence (header information of the objective frame) following the unique word and supplies the error detection result to a selector 211 described later, and only in case that the decoded header information has no error, it supplies the header information to a frame decoder 207 described later and a one-frame delay circuit 212.

204 is a frame length information error detection decoder for applying an error detection decoding process to a received signal sequence (frame length information) following header information n, and in case that there is no error in the frame length information, it outputs the decoded frame length information, and in case that there is an error, it outputs a signal of that purport. An output of the frame length information error detection decoder 204 is supplied to the correlater 202 and the selector 211, and the correlater 202 determines a data position on the received signal sequence where a correlative value related to a unique word is to be next detected according to the output.

205 is a header information error detection decoder for applying an error detection decoding process to a received signal sequence (header information for a frame of one frame before) following the frame length information, and only in case that there is no error in the decoded header information, it supplies the header information to a frame decoder 208 described later. 206 is a frame buffer capable of temporarily storing a signal sequence of one frame portion, and it stores temporarily a received signal sequence supplied from the input terminal 201 side and supplies a part or the whole of the stored received signal sequence to the frame decoder 208. An extraction pattern of a received signal sequence in the frame buffer 206 and its output timing are described later in description of the operation.

The frame decoder 207 decodes a received signal sequence (information data for an objective frame) supplied from the input terminal 201 side by means of header information n supplied from the header information error detection decoder 203, and outputs the decoded information to an output terminal 1-209. And the frame decoder 208 decodes an output of the frame buffer 206 (information data for a frame of one frame before) by means of either of two pieces of header information supplied from the header information error detection decoder 205 and the one-frame delay circuit 212, and outputs the decoded information to an output terminal 2-210. The reason why header information from the one-frame delay circuit 212 has been made usable in the frame decoder 208 is preparations for the case that frame length information has an error, as seen apparently from description of the operation described later.

Moreover, the selector 211 changes over the destination which a received signal sequence from the input terminal 201 is to be supplied to on the basis of an error detection result supplied from the header information error detection decoder 203 and an output of the frame length information error detection decoder 204. As the choices on a destination of supply there are three of the frame decoder 207, the frame buffer 206 and "neither of them". Timing of changing over each of the choices is described in detail in description of the operation described later. The one-frame delay circuit 212 delays by one frame portion and outputs a decoding result (information data for an objective frame) of the header information error detection decoder 203, as apparently seen from the above description. That is to say, two pieces of information data for a frame of one frame before are supplied to the frame decoder 208.

A-2. Operation

Next, operation of the same system having the above-mentioned composition is described with reference to FIGS. 3 to 6 and FIGS. 7A to 7D. FIGS. 7A to 7D each are a diagram for explaining a frame decoding procedure in the same system.

A-2-1. Transmitter Side

In the transmitter side, information data inputted from the input terminal 101 is inputted into the frame composer 109, the header information generator 104 and the frame length information generator 103. In the frame length information generator 103, frame length information is generated on the basis of the size of inputted information data, and in the frame length information error detection encoder 105, the frame length information is error-detection-encoded. In the header information generator 104, header information is generated on the basis of the information data, and in the header information error detection encoder 106, the header information is error-detection-encoded. The error-detection-encoded data of the header information n are inputted into the frame header composer 108 and the one-frame delay circuit 107, and header information n−1 of a frame of one frame before is outputted from the delay circuit 107. Error-detection-encoded data of the frame length information and the header information n are inputted together with a unique word generated by the unique word generator 102 into the frame header composer 108, where a frame header is composed. In the frame composer 109, a frame having the structure shown in FIG. 5 is generated on the basis of information data, the frame header and an output of the one-frame delay circuit 107. The frame is outputted from the output terminal 110 and finally is sent to a transmission channel.

A-2-2. Receiver Side

In the receiver side, a received signal sequence transmitted through a transmission channel is supplied to the input terminal 201. In the correlater 202, a correlative value between the received signal sequence inputted through the input terminal 201 and a unique word is taken with regard to an objective frame n, and if this correlative value is higher than a predetermined threshold value, the header information error detection decoder 203 applies an error detection decoding process to header information n following after the unique word.

Moreover, the frame length information error detection decoder 204 applies an error detection decoding process to frame length information following after the header information n.

(1) In Case That no Error has been Detected in Header Information and Frame Length Information Hereupon, in case that no error has been detected in the header information n and the frame length information, according to a changeover process by the selector 211, only data (information data) of an information data portion determined from the frame length indicated by the frame information out of a received signal sequence from the input terminal 201 are inputted into the frame decoder 207. In the frame decoder 207, the information data are decoded on the basis of the header information n, and the decoded information data are outputted from the output terminal 1-209. And as shown in FIG. 7A, a data position on a received signal sequence in which a unique word is to be next detected is determined on the basis of the frame length information decoded by the frame length information error detection decoder 204, and in case that the next frame n+1 has become an objective frame, a process of detecting the unique word is started at the data position.

(2) In Case That an Error has been Detected only in Header Information

And as shown in FIG. 7B, in case that an error has been detected in header information n of an objective frame n in the header information error detection decoder 203 and no error has been detected in frame length information in the frame length information error detection decoder 204, only information data in an information data portion determined from a frame length indicated by the frame length information are inputted from the input terminal 201 into the frame buffer 206, and are temporarily stored here. And the next frame n+1 becomes an objective frame, and in case that with regard to this objective frame n+1, header information n (header information for the frame n of one frame before) has been detected without error in the header information error detection decoder 205, the header information n is inputted into the frame decoder 208 and information data for the frame n of one frame before are inputted from the frame buffer 206 into the frame decoder 208. In this case, since it is only one piece of header information n that is inputted into the frame decoder 208, the frame decoder 208 decodes information data from the frame buffer 206 on the basis of the header information n from the header information error-detection-decoder 205. The decoded information data are outputted from the output terminal 2-210. At this time, a decoding process on the objective frame n+1 is also performed concurrently with the above-mentioned process, and if there is no error in both of the header information n+1 decoded by the header information error detection decoder 203 and the frame length information decoded by the frame length information error detection decoder 204, the information data for the frame n are outputted from the output terminal 1-209. That is to say, the information data in the objective frame n+1 are outputted from the output terminal 1-209, and the information data in the frame n of one frame before are outputted from the output terminal 2-210.

(3) In Case That an Error has been Detected only in Frame Length Information

And as shown in FIG. 7C, in case that no error has been detected in header information n of an objective frame n in the header information error detection decoder 203 and an error has been detected in frame length information in the frame length information error detection decoder 204, an information data portion and its following are inputted through the input terminal 201 into the frame buffer 206, and are temporarily stored here. And the header information is inputted into the one-frame delay circuit 212. And the next frame n+1 becomes an objective frame, but since frame length information cannot be used here, a process of detecting a unique word is started at the beginning position of the information data portion and at the point of time when the unique word of the next frame n+1 and the header information n+1 have been detected the starting position of the next frame n+1 (the end position of the frame n) is determined.

When the unique word and the header information n+1 of the next frame n+1 are detected and the next frame becomes an objective frame, supply of a received signal sequence from the input terminal 201 to the frame buffer 206 is stopped by the selector 211, and information data obtained by removing an unnecessary signal sequence (the unique word and the header information n+1 of the objective frame n+1) from the received signal sequence stored in the frame buffer 206 are supplied to the frame decoder 208. And the one-frame delay circuit 212 supplies the temporarily stored header information n to the frame decoder 208 and has the header information n+1 inputted from the header information error detection decoder 203. In the frame decoder 208, a decoding process using the header information n supplied from the one-frame delay circuit 212 is applied to the information data supplied from the frame buffer 206 and the decoding result is outputted from the output terminal 2-210 as information data of a frame of one frame before. At this time, in the same way as subsection (2), a decoding process on the objective frame is also performed concurrently with the above-mentioned process. In case that no error is contained in the decoding result by the header information error detector 205, it is possible also that the decoding result is supplied to the frame decoder 208 and in the frame decoder 208 the information data from the frame buffer 206 are decoded using either of them.

(4) In Case That an Error has been Detected in each of Header Information and Frame Length Information And in case that a burst error has occurred and as shown in FIG. 7D an error has been detected in each of the header information n and frame length information of an objective frame n, the information data portion of the objective frame n and its following are inputted from the input terminal 201 into the frame buffer 206, and are temporarily stored here. And in the same way as the above-mentioned subsection (3), when the next frame n+1 becomes an objective frame, supply of a received signal sequence from the input terminal 201 to the frame buffer 206 is stopped by the selector 211, and information data obtained by removing an unnecessary signal sequence (the unique word and the header information n+1 of the objective frame n+1) from the received signal sequence stored in the frame buffer 206 are supplied to the frame decoder 208. Moreover, in case that no error is contained in the decoding result (the header information n of the frame n of one frame before) by the header information error detector 205, the header information n is supplied to the frame decoder 208 and the information data are decoded on the basis of the header information n. This decoding result is outputted from the output terminal 2-210 as the information data of the frame n of one frame before. At this time, in the same way as subsection (2), a decoding process on the objective frame n+1 is also performed concurrently with the above-mentioned process.

A-3. Supplement

In this way, the same system realizes a high-accuracy variable length frame synchronization by using together a synchronization detection using a correlation process of a unique word and an error detection process of header information, and a synchronization detection using frame length information. Moreover, it is possible to determine the position of each header information by establishing a frame synchronization through adding header information applied with only an error detection encoding process to the end of a frame or to the frame header of the next frame and repeatedly transmitting them. Therefore, a frame synchronization can be established, header information containing no error can be easily selected from plural pieces of header information. Accordingly, in a communication environment in which a burst code error occurs, it is possible to realize a high-accuracy frame synchronization and protection of header information at the same time. Furthermore, since only an error detection process is applied to the added header information, an advantage that increase of the redundancy of transmission data is a little can be also obtained.

Figure 6:
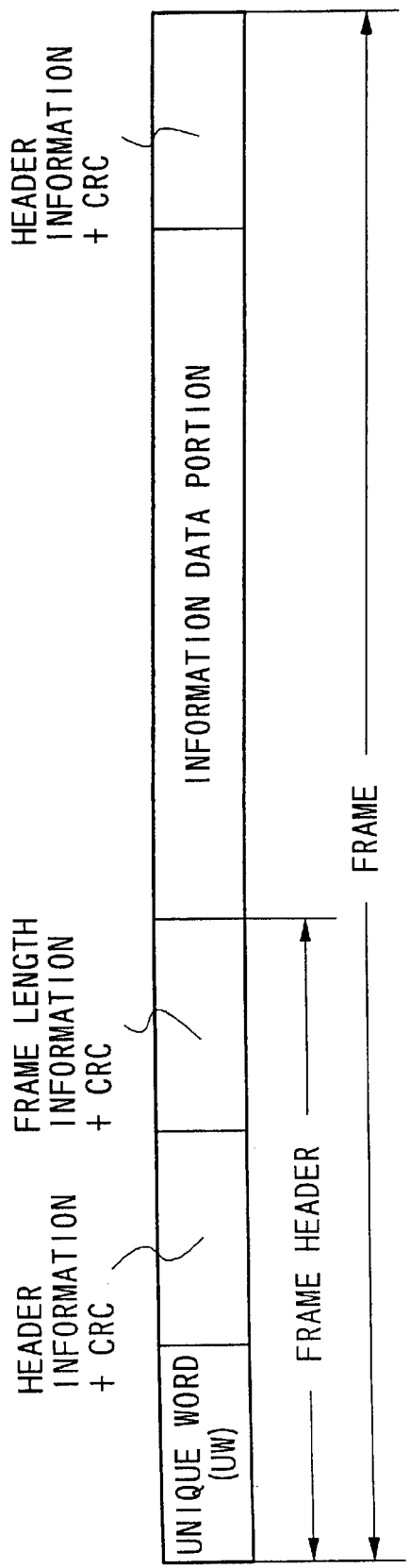
FIG. 6 is a diagram showing a frame structure example of a variable length frame to be transmitted in the same system.

The frame structure of a variable length frame to be transmitted in the same system is not limited to the structures exemplified in FIGS. 5 and 6. Variation examples for transmitting variable length frames having structures other than the frame structures shown in FIGS. 5 and 6 are described in the following.

A-4. Variation Examples

Figure 8:
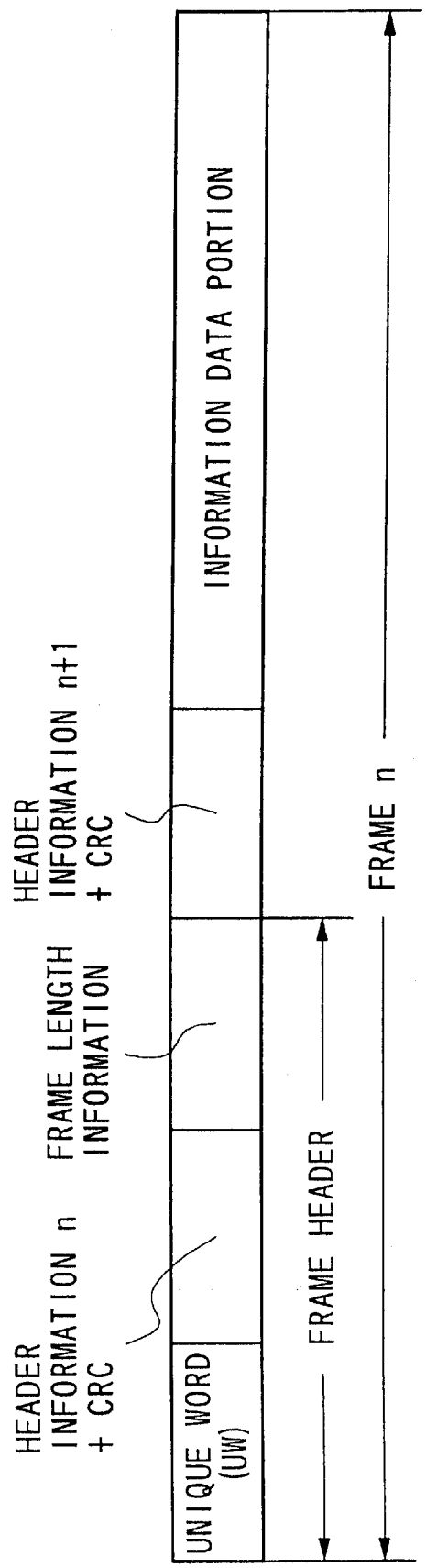
FIG. 8 is a diagram showing the frame structure of a variable length frame to be transmitted in a variation example of the same system.

FIG. 8 is a diagram showing the frame structure of a variable length frame to be transmitted in a variation example of the same system, and this frame structure is different from the frame structure shown in FIG. 5 only in a fact that an error detection encoding process by CRC is not applied to frame length information.

Figure 9:
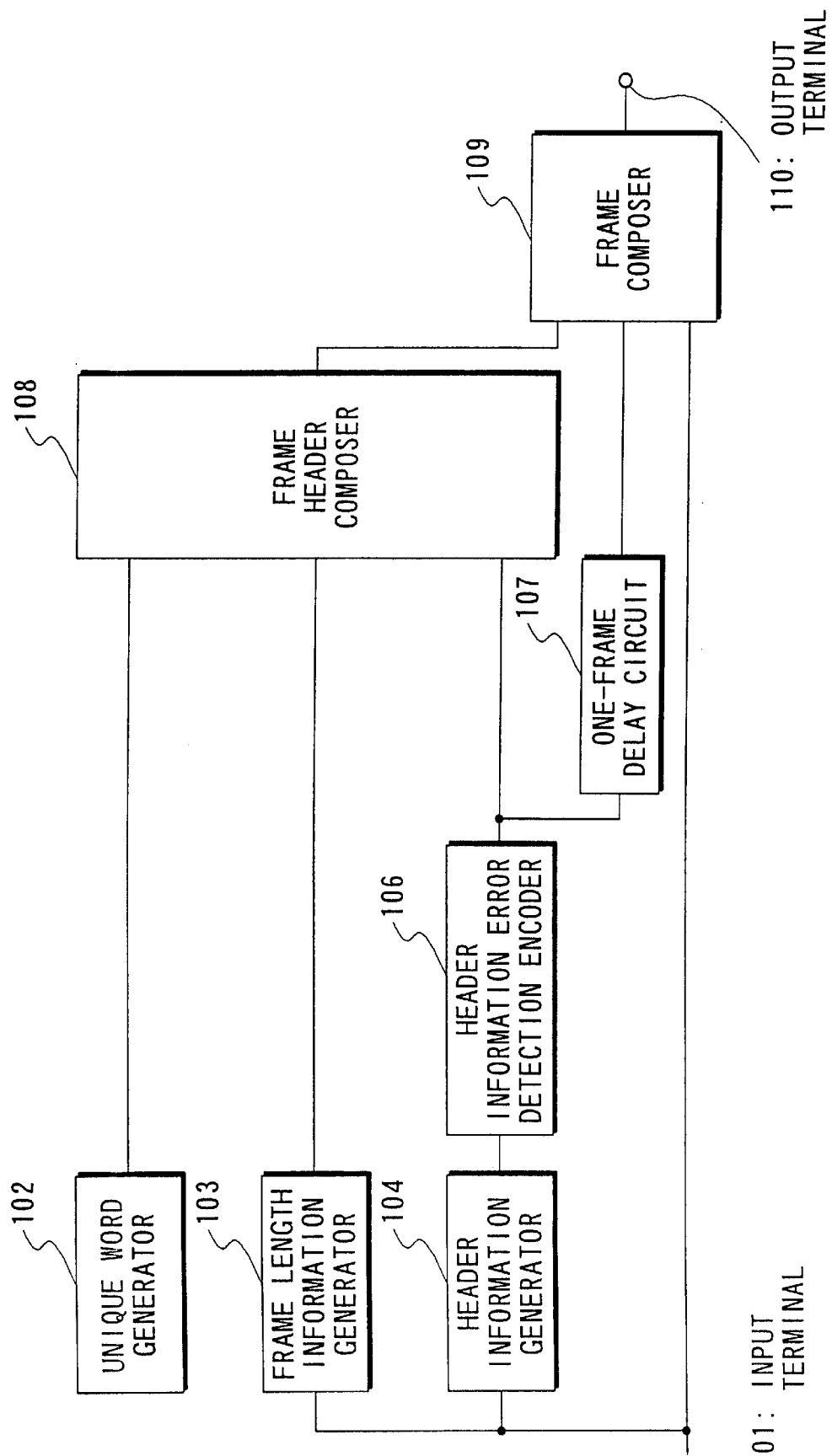
FIG. 9 is a block diagram showing the composition of a data sequence generator in the same variation example.

FIG. 9 is a block diagram showing the composition of a data sequence generator in the same variation example, and is different from the composition shown in FIG. 3 only in a fact that the frame length information error detection encoder 105 is removed from the composition shown in FIG. 3 and output of the frame length information generator 103 is directly inputted into the frame header composer 108.

Figure 10:
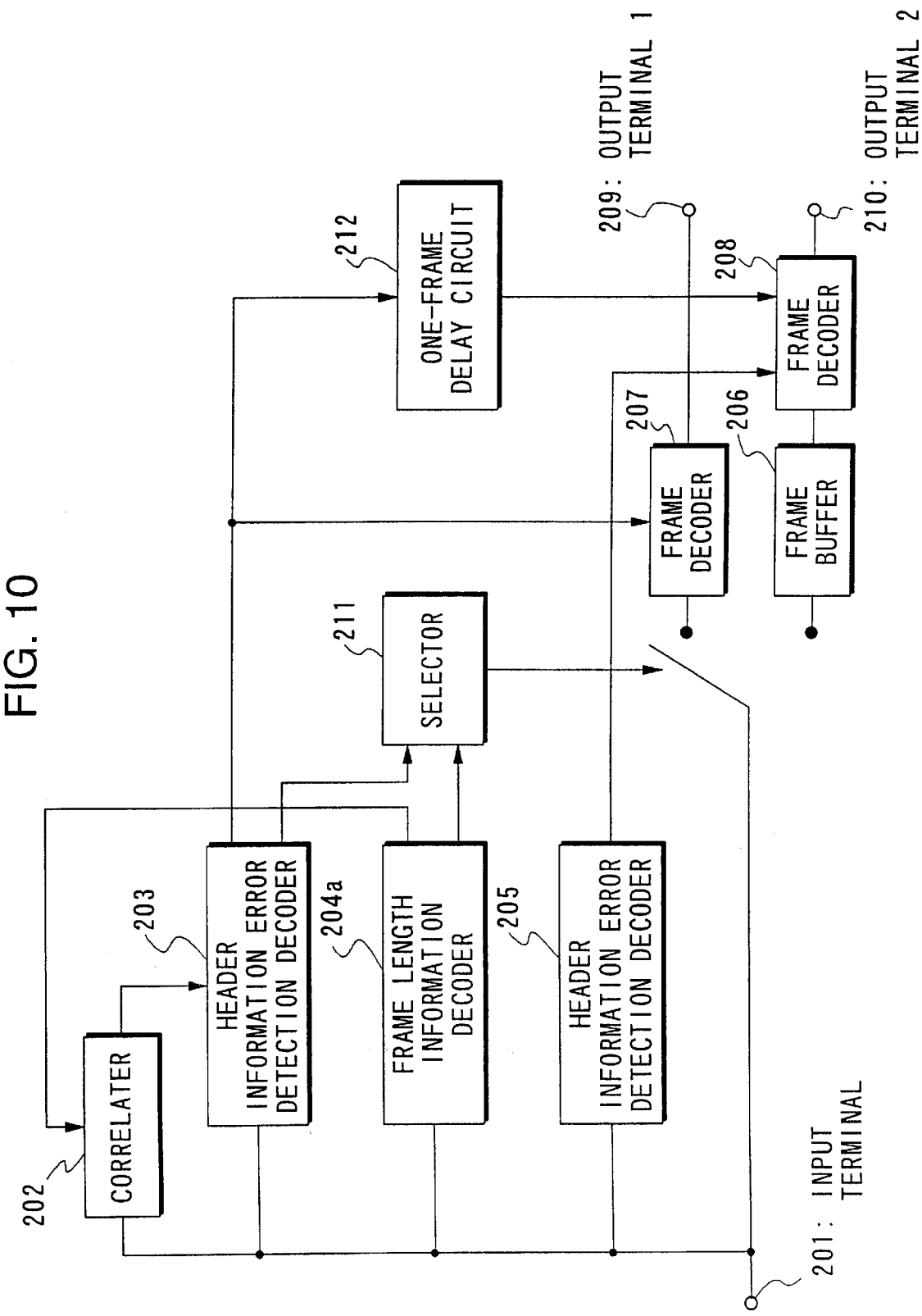
FIG. 10 is a block diagram showing the composition of an information data decoder in the same variation example.

FIG. 10 is a block diagram showing the composition of an information data decoder in the same variation example, and this composition is different from the composition shown in FIG. 4 only in a fact that it is provided with a frame length information decoder 204a in place of the frame length information error detection decoder 204. The frame length information decoder 204a decodes a received signal sequence (frame length information) following after the header information n and outputs the decoded frame length information to the correlater 202 and the selector 211.

Since operation of the same variation example is the same as the first embodiment except that an error detection process is not performed on frame length information, description of it is omitted.

B. Second Embodiment

A variable length data transmission system having a transmitter and a receiver according to a second embodiment of the present invention is described.

The same system has basically the same function as the system according to the first embodiment, but is different from the system according to the first embodiment only in a fact that an error detection encoding process and an error correction encoding process are applied to one piece of header information to be used for establishing a frame synchronization out of two pieces of header information contained in one frame and to the frame length information, and only an error detection encoding process is applied to the other piece of header information. Therefore, description of the portions common to the first embodiment is omitted in the following description.

B-1. Composition

Figure 11:
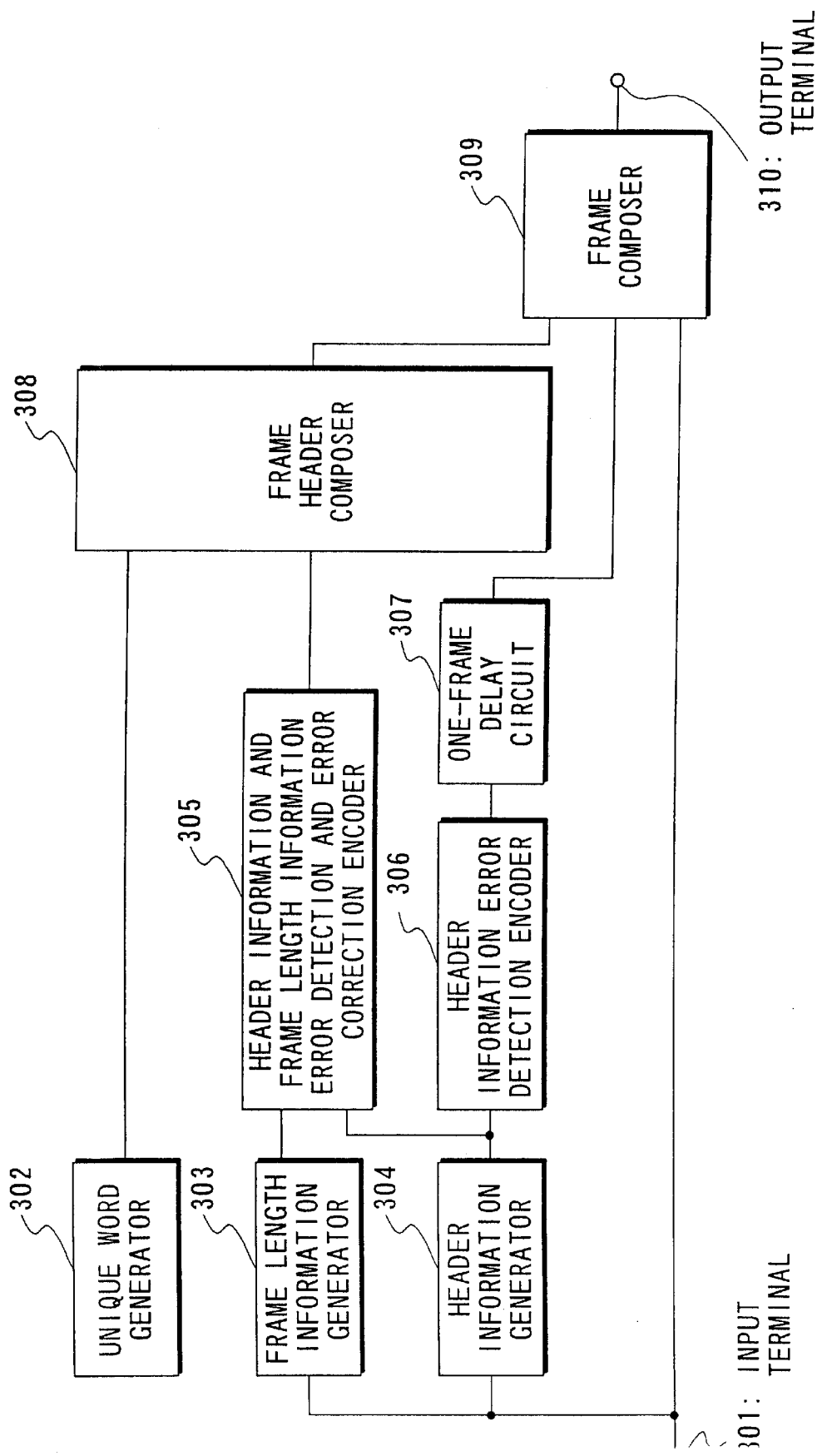
FIG. 11 is a block diagram showing the composition of a data sequence generator in a variable length data transmission system having a transmitter and a receiver according to a second embodiment of the present invention.
Figure 12:
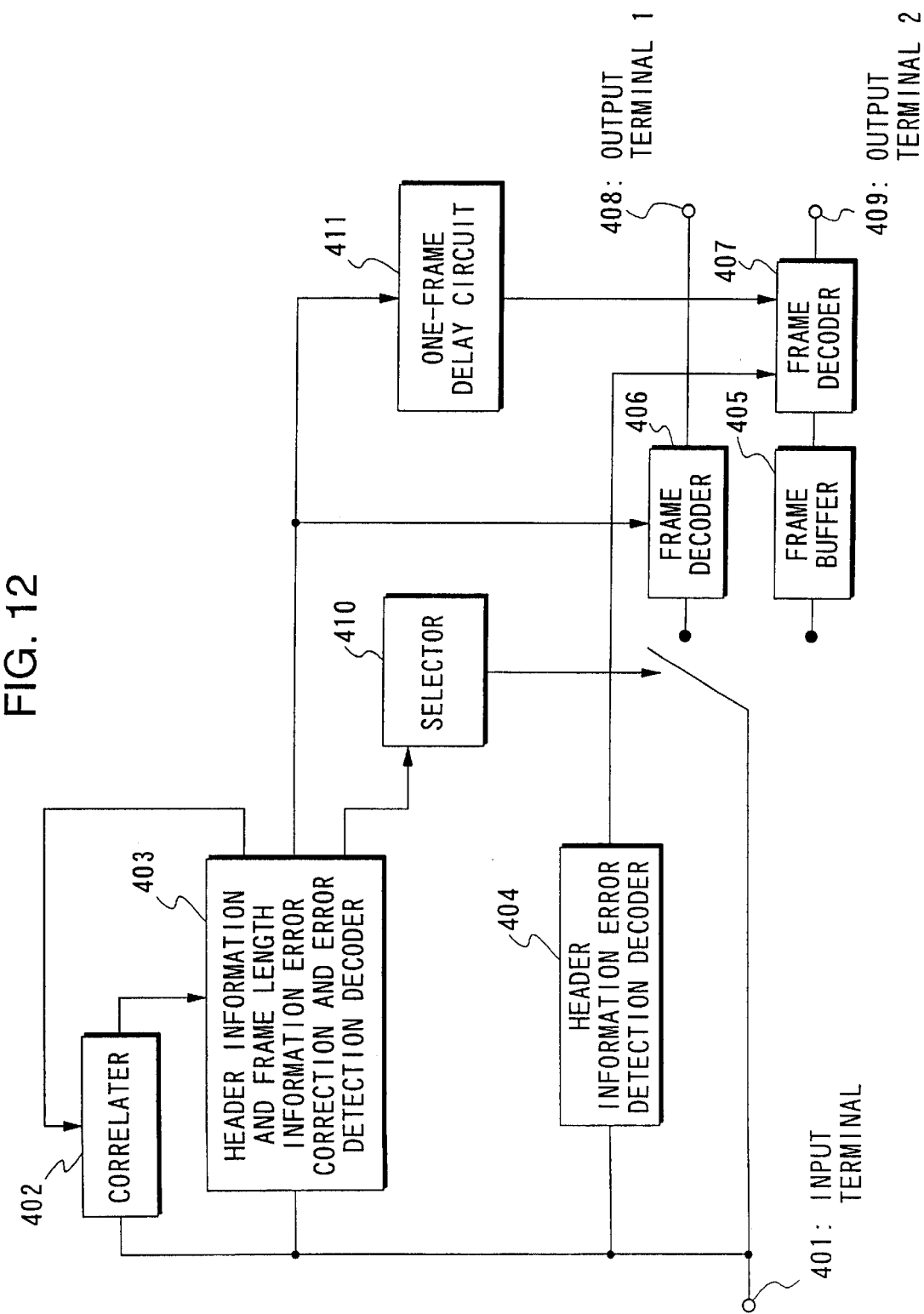
FIG. 12 is a block diagram showing the composition of an information data decoder in the same system.

First, the composition of the same system is described with reference to FIGS. 11 to 14. FIG. 11 is a block diagram showing a data sequence generator in the same system, and FIG. 12 is a block diagram showing an information data decoder in the same system. And FIGS. 13 and 14 each are a frame structure example of a variable length frame to be transmitted in the same system.

B-1-1. Frame Structure

First, the frame structure of a variable length frame to be transmitted in the same system is described with reference to FIGS. 13 and 14.

This embodiment adopts a frame structure as shown in FIG. 5 in the same way as the first embodiment, and as shown in FIGS. 13 and 14 an error detection encoding process using CRC and an error correction encoding process for error correction (for example, FEC: Forward Error Correction) are applied to only header information to be used for establishing a frame synchronization and frame length information. For the purpose of avoiding complication of description, it is assumed that the frame structure shown in FIG. 13 is adopted here.

B-1-2. Compositions of a Data Sequence Generator and an Information Data Decoder Next, the composition of a data sequence generator and that of an information data decoder in the same system are described with reference to FIGS. 11 and 12.

In a data sequence generator shown in FIG. 11, an input terminal 301, a unique word generator 302, a frame length information generator 303, a header information generator 304, a header information error detection encoder 306, a one-frame delay circuit 307, a frame composer 309, and an output terminal 310 have respectively the same functions as the components 101, 102, 103, 104, 106, 107, 109, and 110 of FIG. 3 having the same names as those of FIG. 11. However, this data sequence generator is composed so that output of the header information error detection encoder 306 passes through the one-frame delay circuit 307 without fail.

In FIG. 11, 305 is a header information and frame length information error detection and error correction encoder, which applies an error detection and error correction encoding process to each of outputs of the frame length information generator 303 and the header information generator 304, and outputs each of the encoded data. And a frame header composer 308 in this variation example composes and outputs a frame header by arranging a unique word generated by the unique word generator 302 and the respective outputs (header information n and frame length information to which an error detection and error correction process is applied) of the header information and frame length information error detection and error correction encoder 305 in this order. The frame composer 309 composes a frame by arranging the frame header, an output of the one-frame delay circuit 307 (error-detection-encoded header information n−1 of a frame n−1 of one frame before), and information data from the input terminal 301 in this order, and supplies the composed frame to the output terminal 310.

And in an information data decoder shown in FIG. 12, an input terminal 401, a correlater 402, a header information error detection decoder 404, a frame buffer 405, a frame decoder 406, a frame decoder 407, an output terminal 1-408, an output terminal 2-409, and a one-frame delay circuit 411 have respectively the same functions as the components 201, 202, 205, 206, 207, 208, 209, 210 and 212 of FIG. 3 having the same names as those of FIG. 12.

In FIG. 12, 403 is a header information and frame length information error correction and error detection decoder which applies an error correction decoding and error correction decoding process to header information n and frame length information contained in a received signal sequence, and in case that a correlative value obtained by the correlater 402 is higher than a predetermined threshold value, this error correction and error detection decoder applies the above-mentioned error correction process and error detection process to a received signal sequence (header information n and frame length information) following after the unique word, and if no error is contained in the decoded header information n it supplies the header information to the frame decoder 406 and the one-frame delay circuit 411, and if no error is contained in the decoded frame length information it supplies the decoded frame length information to the correlater 402 and if an error is contained in the decoded frame length information it supplies that purport to the correlater 402, and it supplies signals corresponding to the error detection result with regard to the header information n and the frame length information, and to the decoded frame length information to a selector 410 described later.

The selector 410 selects and changes over the destination to which a received signal sequence from the input terminal 401 is to be supplied out of three destinations of the frame decoder 406, the frame buffer 405 and "neither of them" on the basis of a signal supplied from the header information and frame length information error correction and error detection decoder 403. Since this changeover pattern and its timing are the same as the first embodiment, description of them is omitted here.

B-2. Operation

Next, operation of the same system is described with reference to FIGS. 11 to 14. However, description of the portions common to the first embodiment is omitted.

B-2-1. Transmitter Side

In the transmitter side, when information data are inputted from the input terminal 301, the information data are inputted into the frame composer 309 and are inputted into the header information generator 304 and the frame length information generator 303. Outputs (header information n and frame length information) of the header information generator 304 and the frame length information generator 303 are each applied with an error detection encoding and error correction encoding process in the header information and frame length information error detection and error correction encoder 305 and then are outputted. In the frame header composer 308, a unique word generated by the unique word generator 302 and an output of the header information and frame length information error detection and error correction encoder 305 are arranged in this order to be composed into a frame header.

And output of the header information generator 304 is inputted also into the header information error detection encoder 306, and the header information n which has been error-detection-encoded here is inputted into the one-frame delay circuit 307. Error-detection-encoded data of header information n−1 of a frame of one frame before are outputted from this one-frame delay circuit 307. In the frame header composer 308, the frame header, the output (header information n−1) of the one-frame delay circuit 307 and information data from the input terminal 301 are arranged in this order and thereby a frame n shown in FIG. 13 is obtained. The frame n is outputted from the output terminal 110 and is eventually sent out to a transmission channel.

B-2-2. Receiver Side

Operation of the receiver side is basically the same as operation of the receiver side in the first embodiment operation of the receiver side in this embodiment is different from operation of the receiver side in the first embodiment only in a fact that an error detection decoding process is applied to header information n to be used for establishing a frame synchronization and frame length information and then an error detection decoding process is applied to them. Description of the other common operations is omitted.

B-3. Supplement

In this way, according to the same system, since not only error detection but also error correction is performed, although its redundancy becomes higher in comparison with that of a variable length data transmission system according to the first embodiment, it is possible to more improve the accuracy of a frame synchronization and the decoding rate of information data. Since an error correction process is not applied to the header information not to be used for establishing a frame synchronization, it is possible to suppress low the increase of redundancy of transmission data which would have been caused by an error correction encoding process. The frame structure of a variable length frame to be transmitted in the same system is not limited to the structures exemplified in FIGS. 13 and 14. variation examples 1 to 5 for transmitting variable length frames having other structures than the frame structures shown in FIGS. 13 and 14 are described in the following.

B-4. Variation Example 1

FIG. 15 is a diagram showing the frame structure of a variable length frame to be transmitted in a variation example 1 of the same system, and this frame structure is different from the frame structure shown in FIG. 13 only in a fact that only an error detection encoding process is applied to frame length information.

Figure 16:
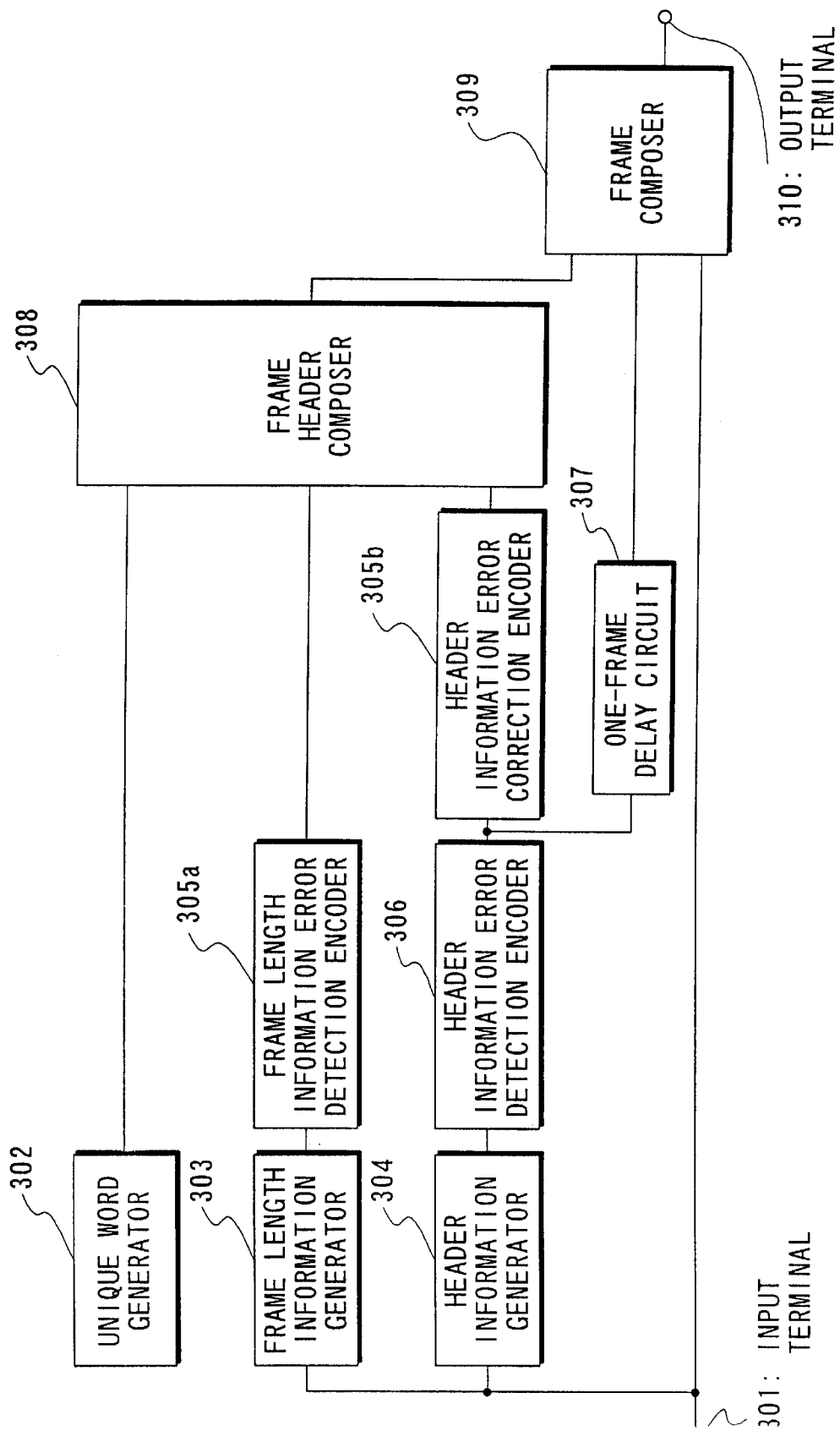
FIG. 16 is a block diagram showing the composition of a data sequence generator in the same variation example.

FIG. 16 is a block diagram showing the composition of a data sequence generator in the same variation example, and this composition is different from the composition shown in FIG. 11 in that a frame length information error detection encoder 305a is provided in place of the header information and frame length information error detection and error correction encoder 305, that a header information error correction encoder 305b is provided in parallel with the one-frame delay circuit 307 at a stage following after the header information error detection encoder 306, and that output of the header information generator 304 is inputted only into the header information error detection encoder 306. The frame length error detection encoder 305a applies an error detection encoding process to an output of the frame length information generator 303 and outputs it to the frame header composer 308. And the header information error correction encoder 305b applies an error detection encoding process to an output of the header information error detection encoder 306 and inputs it into the frame header composer 308.

Figure 17:
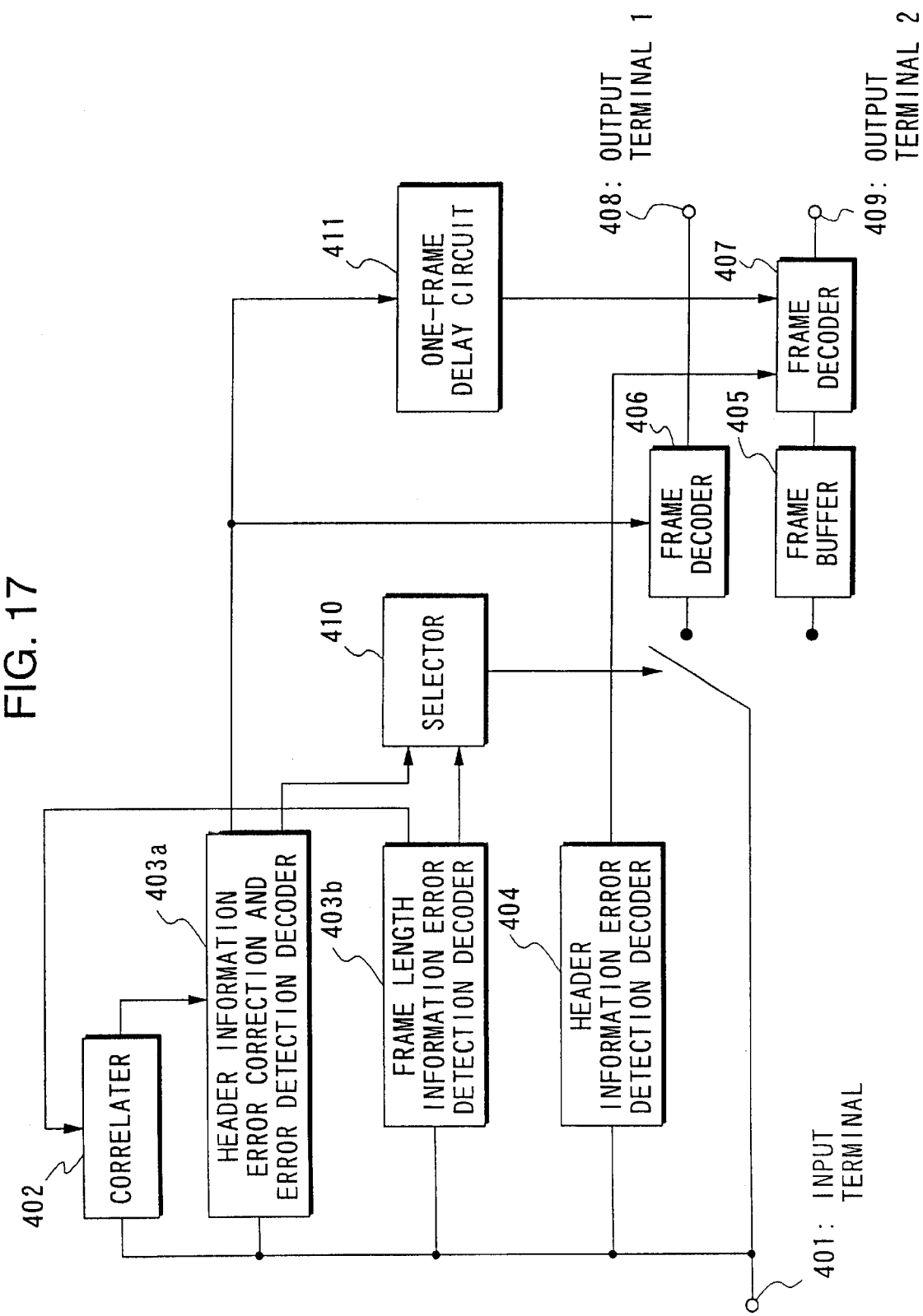
FIG. 17 is a block diagram showing the composition of an information data decoder in the variation example.

FIG. 17 is a block diagram showing the composition of an information data decoder in the same variation example, and this composition is different from the composition shown in FIG. 12 in that a header information error correction and error detection decoder 403a and a frame length information error detection decoder 403b are provided in place of the header information and frame length information error correction and error-detection decoder 403. The frame length information error detection decoder 403b applies an error detection decoding process to frame length information contained in a received signal sequence and supplies the decoded frame length information or the error detection result of the frame length information to the correlater 402 and the selector 410. In case that a correlative value obtained by the correlater 402 is higher than a predetermined threshold value, the header information error correction and error detection decoder 403a applies the error correction decoding and error detection decoding process to a received signal sequence (header information n) following after a unique word, and supplies a signal corresponding to the error detection result of the header information n to the selector 410, and only in case that no error is contained in the decoded header information n, it supplies the header information n to the frame decoder 406 and the one-frame delay circuit 411. This selector 410 operates in the same way as the selector 410 in FIG. 12.

B-5. Variation Example 2

Figure 18:
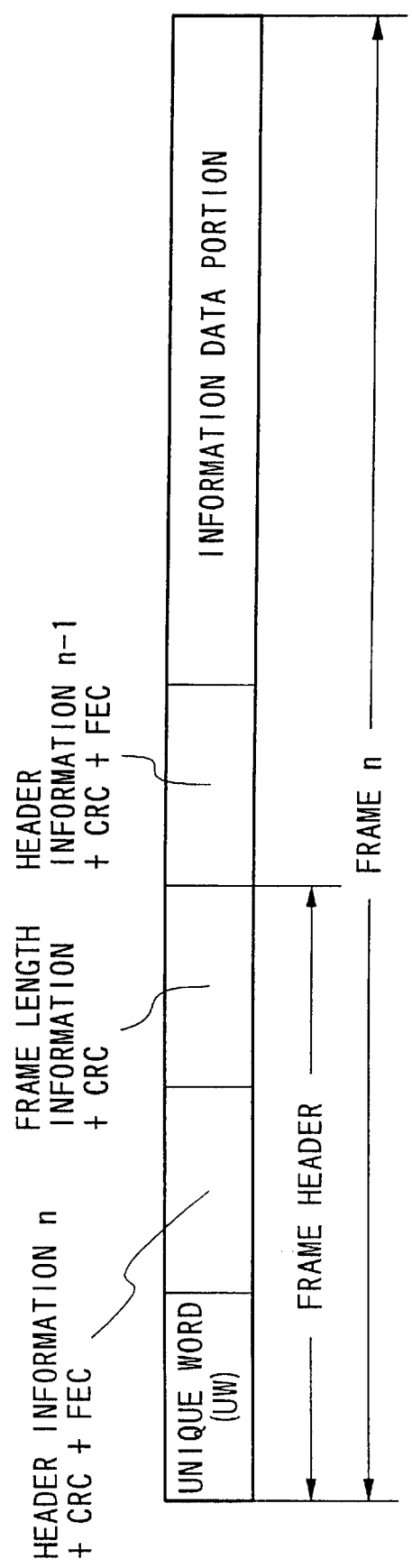
FIG. 18 is a diagram showing the frame structure of a variable length frame to be transmitted in a second variation example of the same system.

FIG. 18 is a diagram showing the frame structure of a variable length frame to be transmitted in a variation example 2 of the same system, and this frame structure is different from the frame structure shown in FIG. 15 in a fact that an error detection and error correction encoding process is applied also to the header information (header information n-1) not to be used for establishing a frame synchronization.

Figure 19:
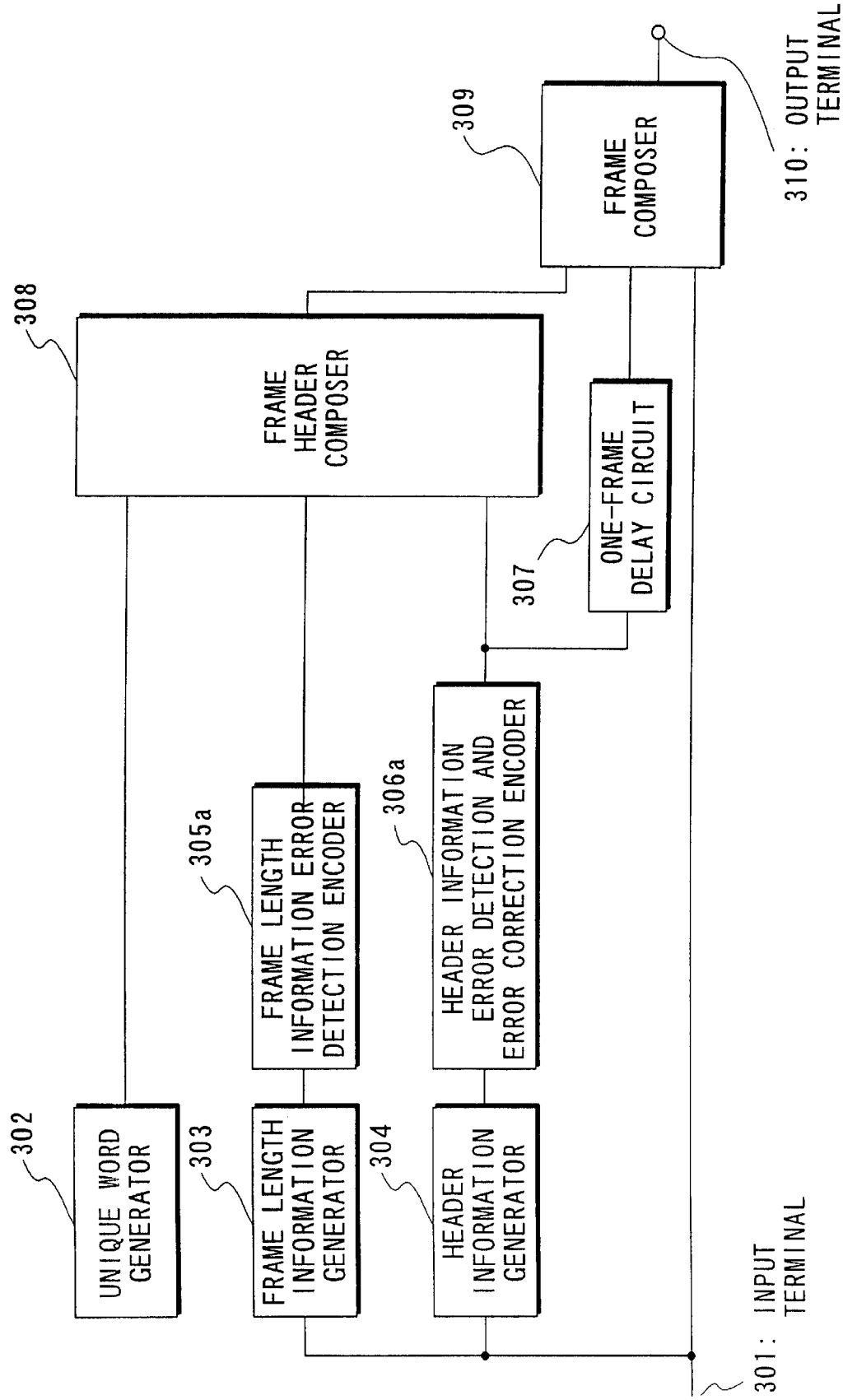
FIG. 19 is a block diagram showing the composition of a data sequence generator in the same variation example.

FIG. 19 is a block diagram showing the composition of a data sequence generator in the same variation example, and this composition is different from the composition shown in FIG. 16 in that a header information error detection and error correction encoder 306a is provided in place of the header information error detection encoder 306 and that the header information error correction encoder 305b is removed and one of outputs of the header information error detection and error correction encoder 306a is inputted directly into the frame header composer 308.

Figure 20:
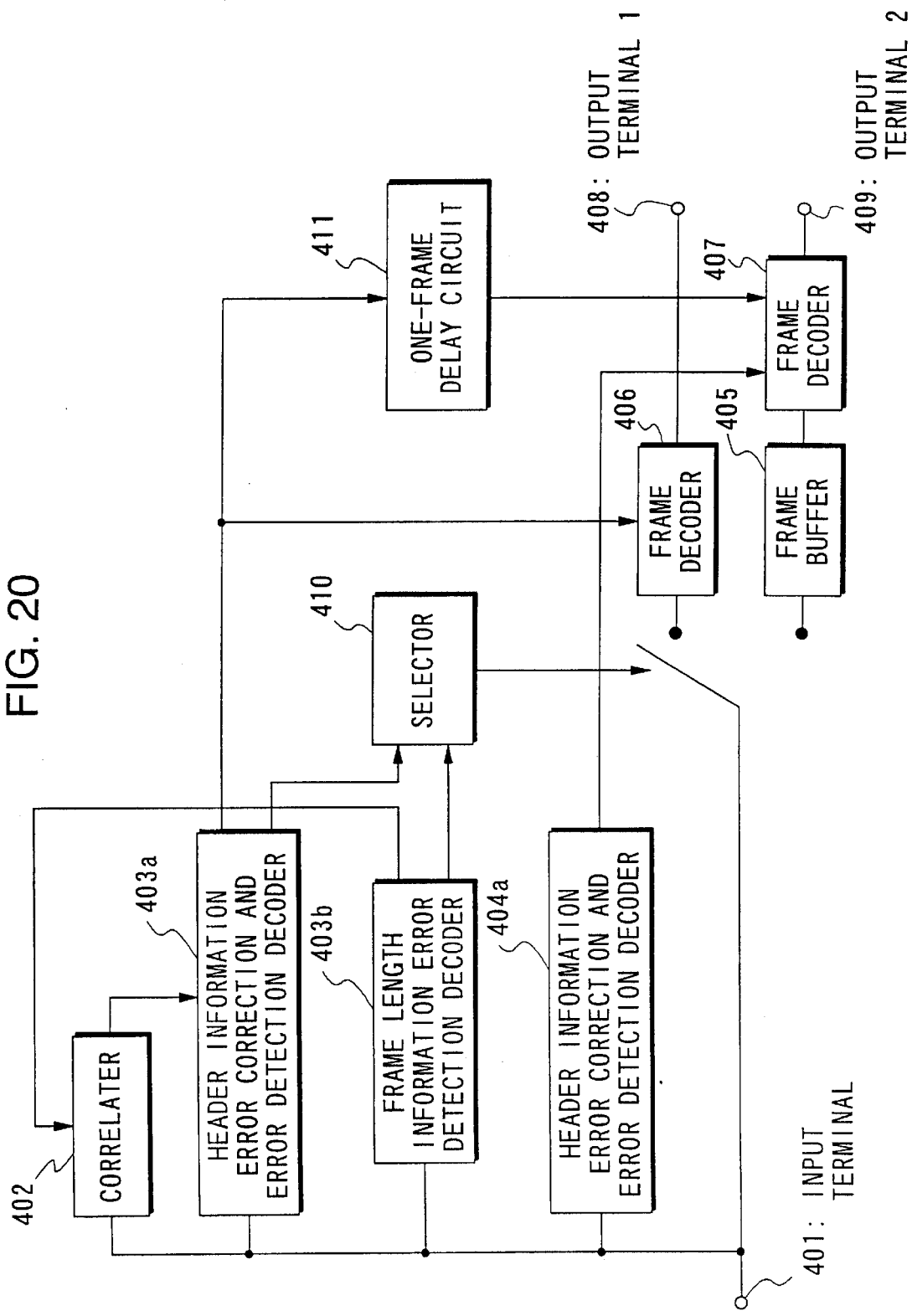
FIG. 20 is a block diagram showing the composition of an information data decoder in the variation example.

FIG. 20 is a block diagram showing the composition of an information data decoder in the same variation example, and this composition is different from the composition shown in FIG. 17 in that a header information error correction and error detection decoder 404a is provided in place of the header information error detection decoder 404. The header information error correction and error detection decoder 404a applies an error correction decoding and error detection decoding process to a received signal sequence (header information n-1) following after frame length information, and only in case that no error is contained in the decoded header information n-1, it supplies the header information n-1 to the frame decoder 407.

B-6. Variation Example 3

Figure 21:
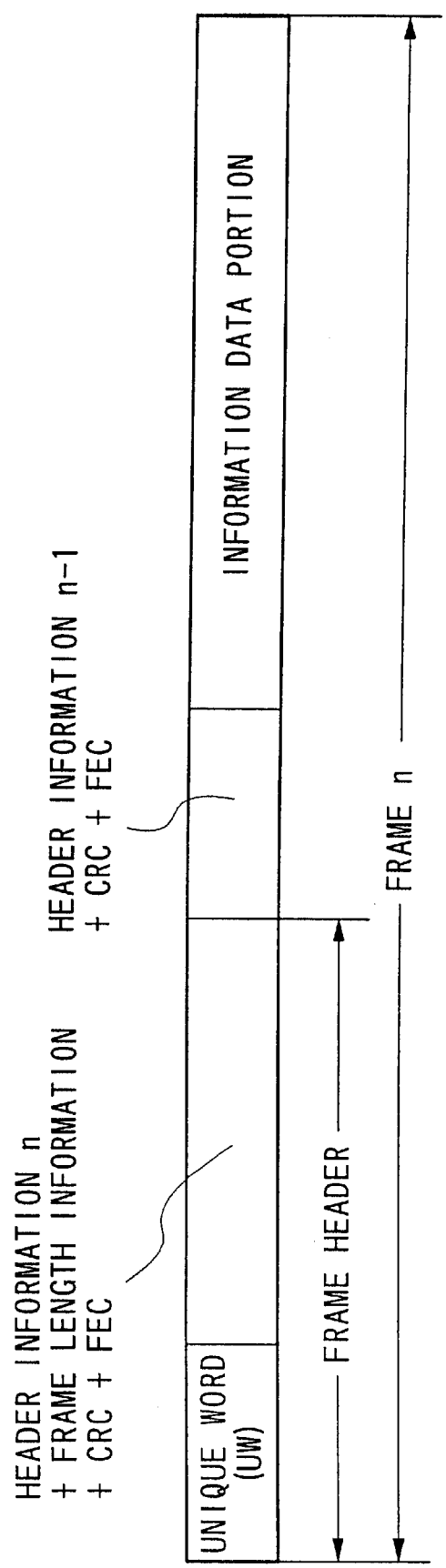
FIG. 21 is a diagram showing the frame structure of a variable length frame to be transmitted in a third variation example of the same system.

FIG. 21 is a diagram showing the frame structure of a variable length frame to be transmitted in a variation example 3 of the same system, and this frame structure is different from the frame structure shown in FIG. 13 in a fact that an error detection and error correction encoding process is applied also to the header information (header information n-1) not to be used for establishing a frame synchronization.

Figure 22:
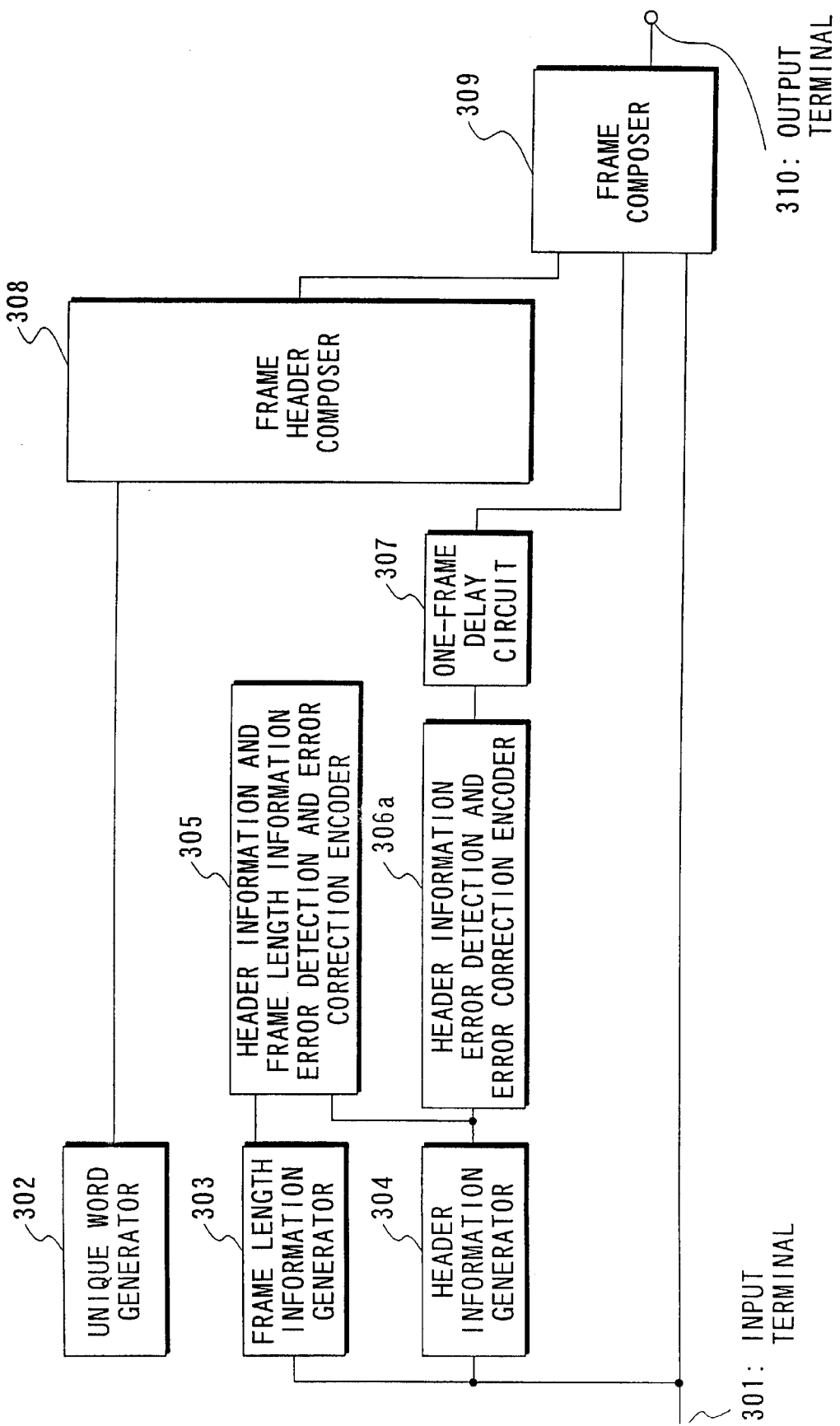
FIG. 22 is a block diagram showing the composition of a data sequence generator in the same variation example.

FIG. 22 is a block diagram showing the composition of a data sequence generator in the same variation example, and this composition is different from the composition shown in FIG. 11 in a fact that a header information error detection and error correction encoder 306a in the variation example 2 is provided in place of the header information error detection encoder 306. This header information error detection and error correction encoder 306a applies an error detection and error correction encoding process to output of the header information generator 304 and outputs the result to the one-frame delay circuit 307.

Figure 23:
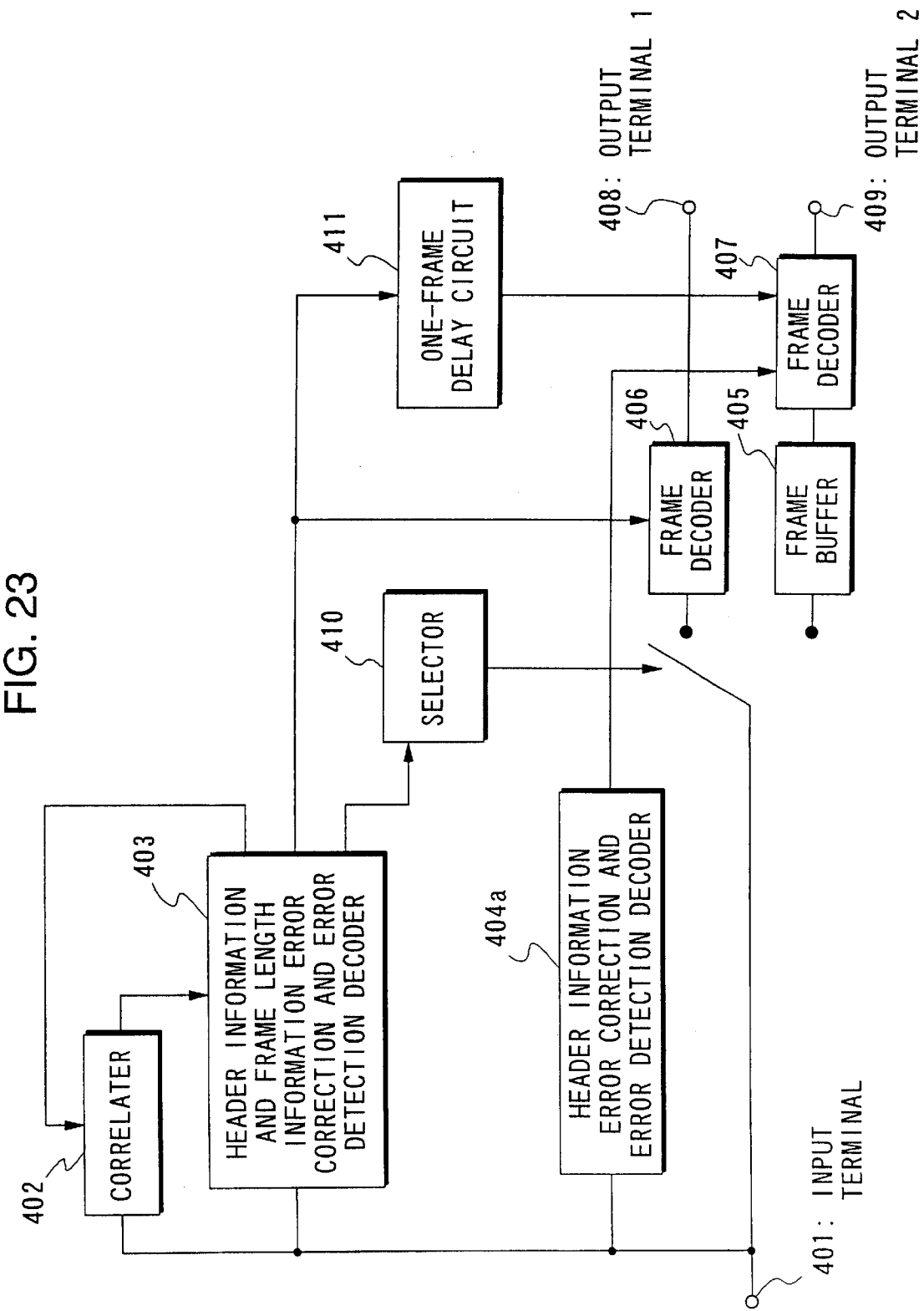
FIG. 23 is a block diagram showing the composition of an information data decoder in the variation example.

FIG. 23 is a block diagram showing the composition of an information data decoder in the same variation example, and this composition is different from the composition shown in FIG. 12 in that a header information error correction and error detection decoder 404a in the variation example 2 is provided in place of the header information error detection decoder 404. This header information error correction and error detection decoder 404a applies an error correction decoding and error detection decoding process to a received signal sequence (header information n-1) following after frame length information, and only in case that no error is contained in the decoded header information n-1, it supplies the header information n-1 to the frame decoder 407.

B-7. Variation Example 4

Figure 24:
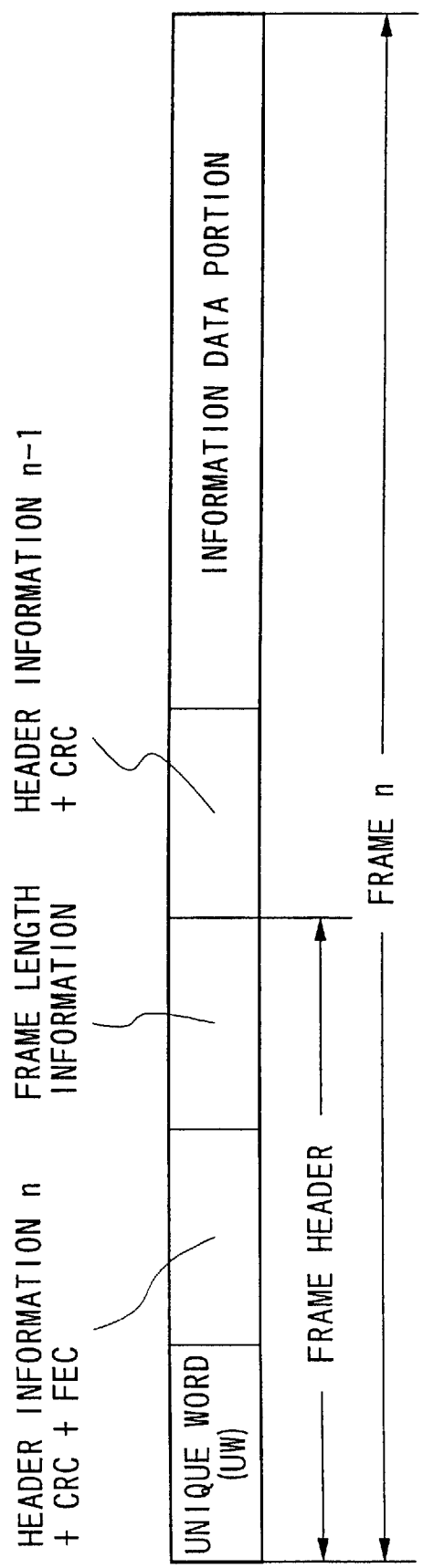
FIG. 24 is a diagram showing the frame structure of a variable length frame to be transmitted in a fourth variation example of the same system.

FIG. 24 is a diagram showing the frame structure of a variable length frame to be transmitted in a variation example 4 of the same system, and this frame structure is different from the frame structure shown in FIG. 15 in a fact that an error detection encoding process is not applied to frame length information.

Figure 25:
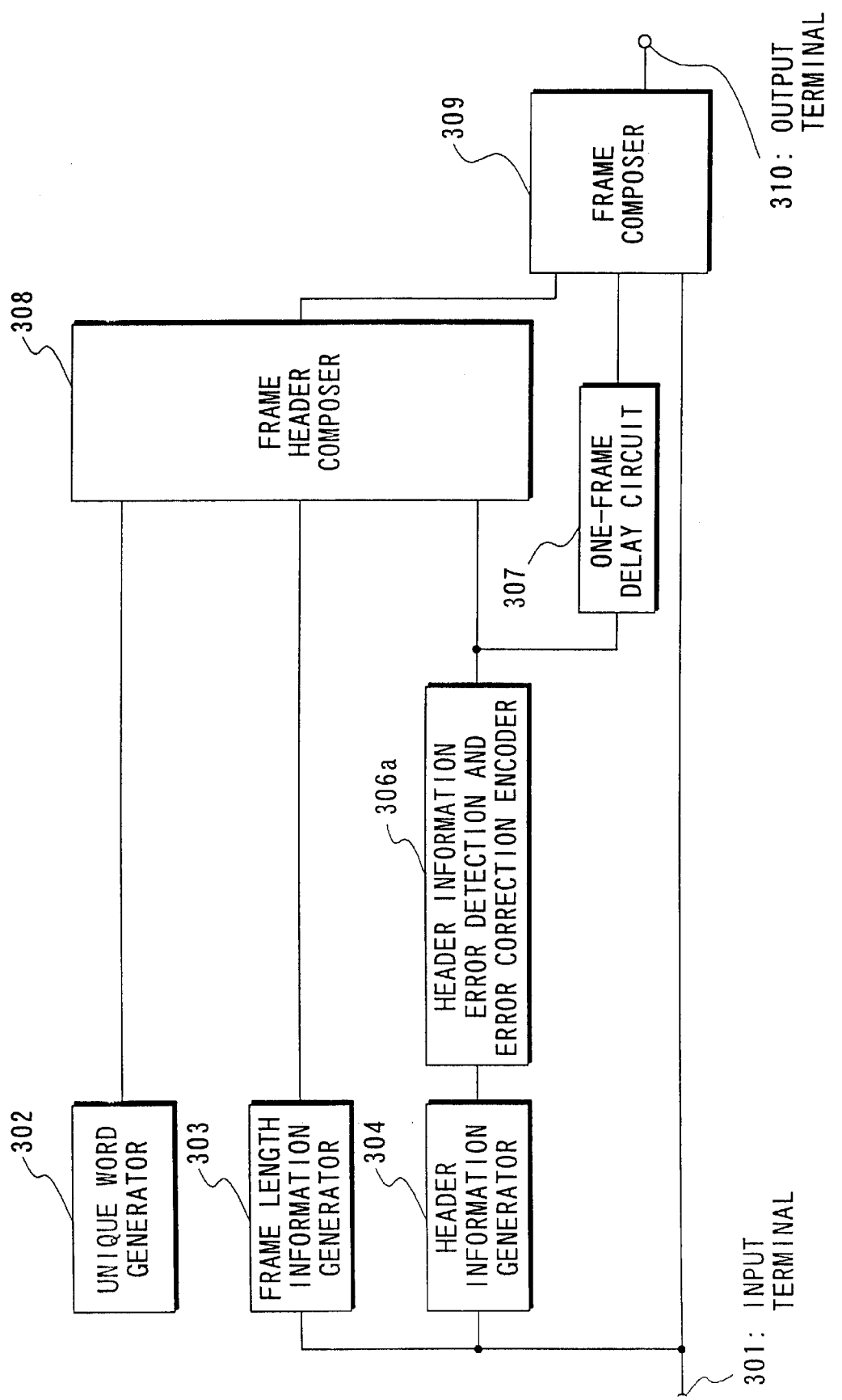
FIG. 25 is a block diagram showing the composition of a data sequence generator in the same variation example.

FIG. 25 is a block diagram showing the composition of a data sequence generator in the same variation example, and this composition is different from the composition shown in FIG. 16 in that the frame length information error detection encoder 305a is removed and the header information error detection and error correction encoder 306a in the variation example 2 is provided in place of the header information error detection encoder 306, and that the header information error correction encoder 305b is removed and output of the header information error detection and error correction encoder 306a is supplied to the one-frame delay circuit 307 and the frame header composer 308.

Figure 26:
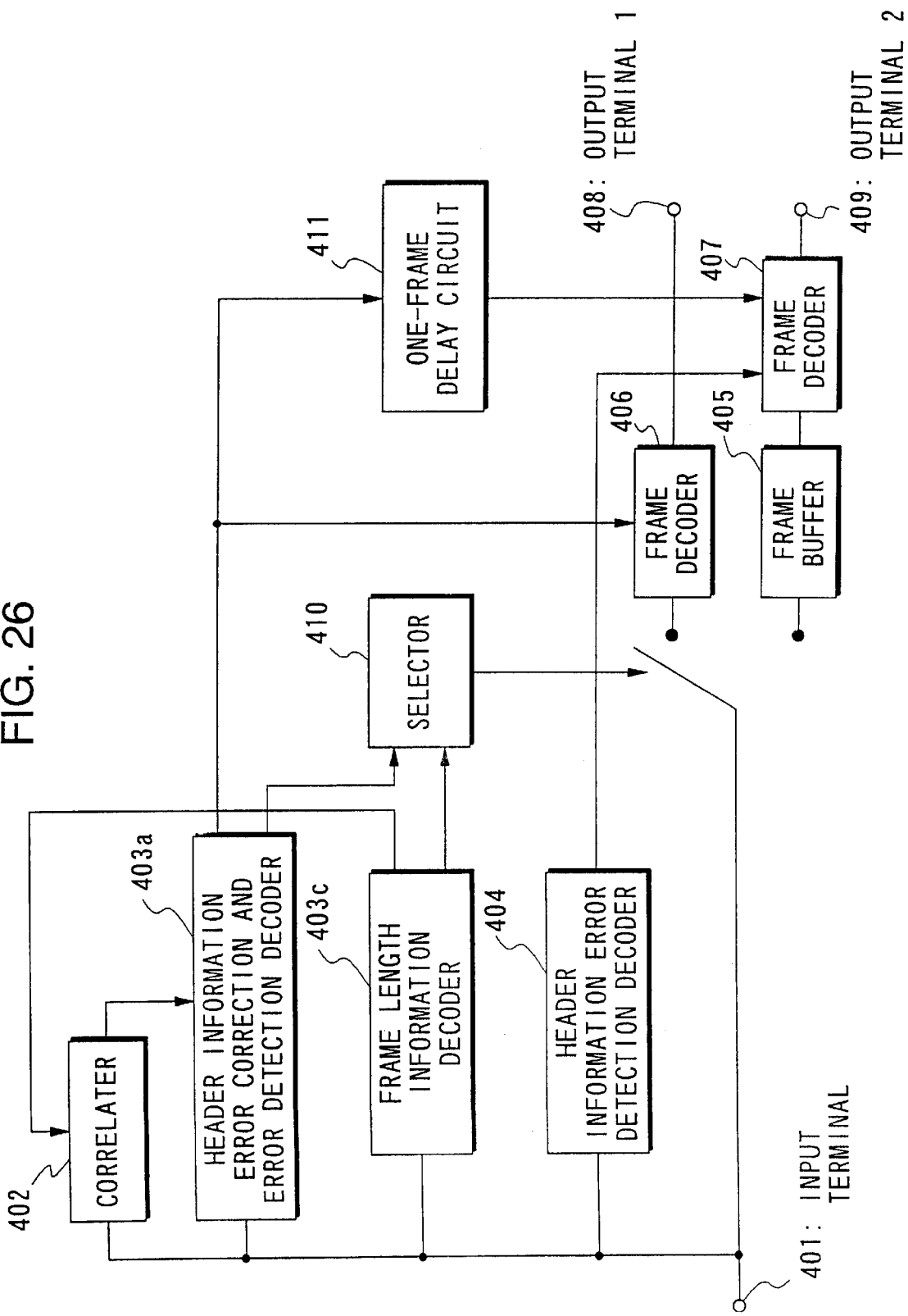
FIG. 26 is a block diagram showing the composition of an information data decoder in the variation example.

FIG. 26 is a block diagram showing the composition of an information data decoder in the same variation example, and this composition is different from the composition shown in FIG. 17 only in a fact that a frame length information decoder 403c is provided in place of the frame length information error detection decoder 403b. This frame length information decoder 403c decodes frame length information from a received signal sequence and supplies the decoded frame length information to the correlater 402.

B-8. Variation Example 5

Figure 27:
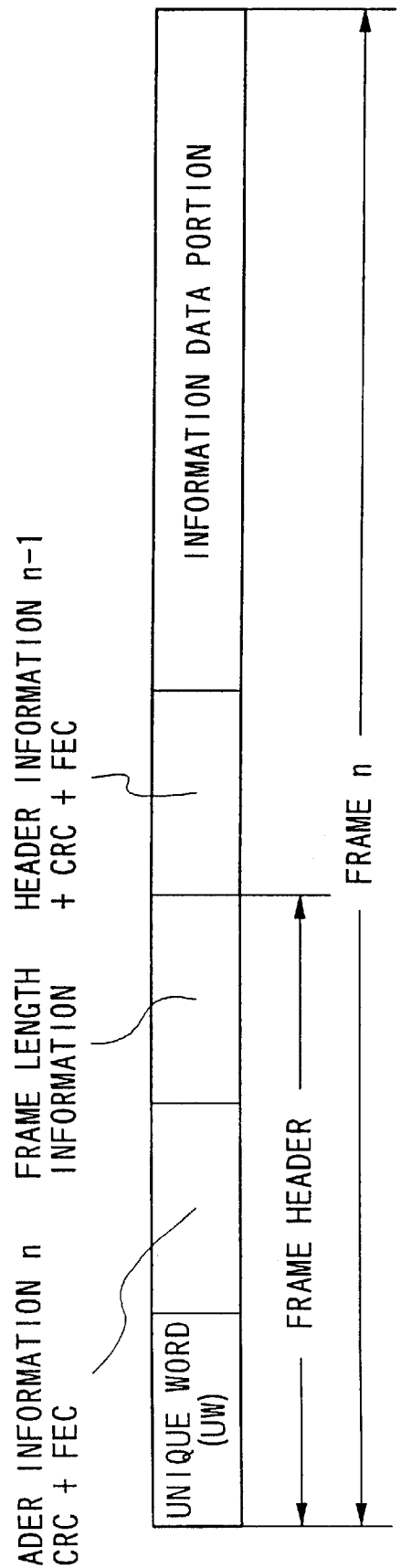
FIG. 27 is a diagram showing the frame structure of a variable length frame to be transmitted in a fifth variation example of the same system.

FIG. 27 is a diagram showing the frame structure of a variable length frame to be transmitted in a variation example 5 of the same system, and this frame structure is different from the frame structure shown in FIG. 21 in a fact that an error detection and error correction encoding process is not applied to frame length information.

Figure 28:
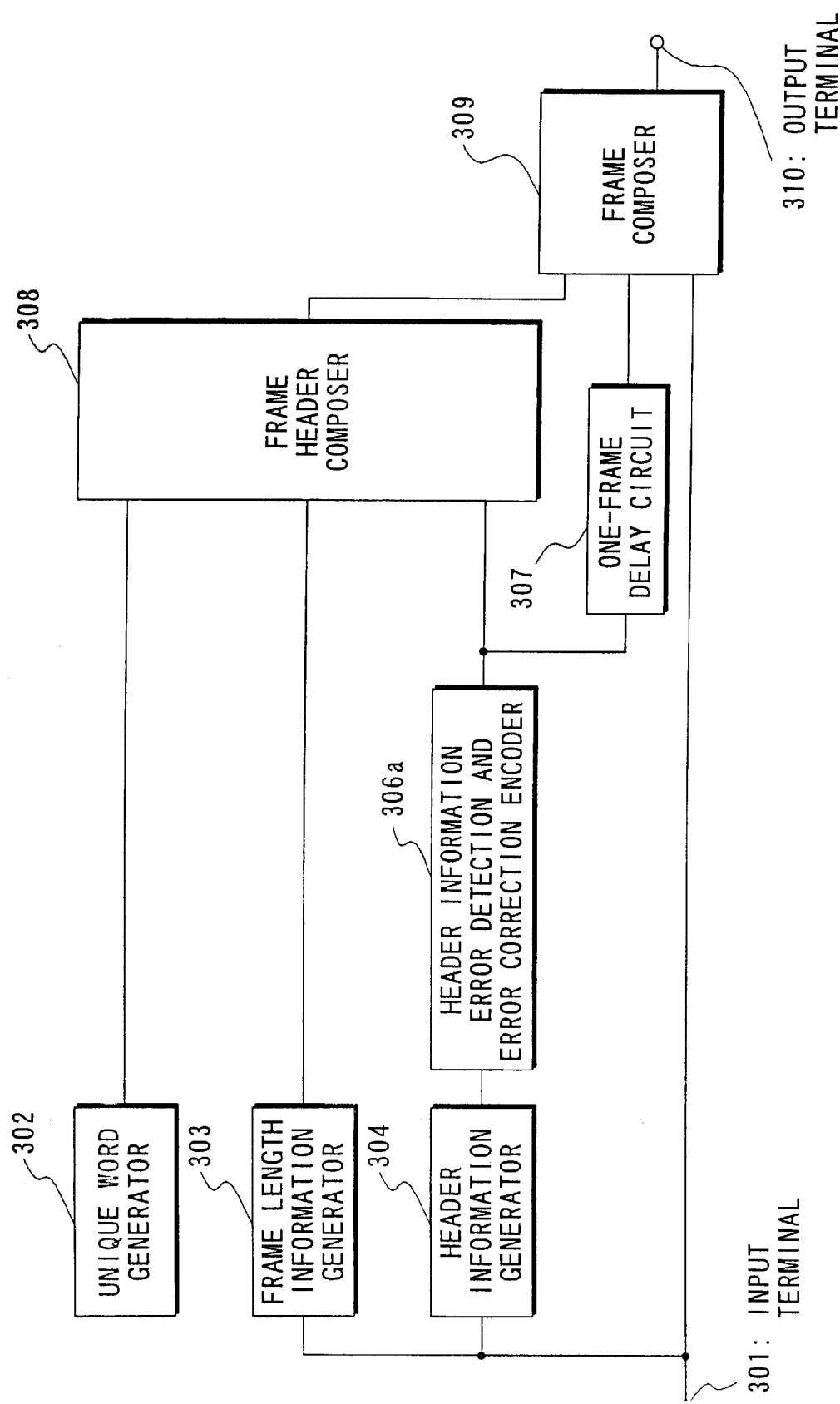
FIG. 28 is a block diagram showing the composition of a data sequence generator in the same variation example.

FIG. 28 is a block diagram showing the composition of a data sequence generator in the same variation example, and this composition is different from the composition shown in FIG. 22 in that the header information and frame length information error detection and error correction encoder 306a is removed from the composition shown in FIG. 22 and output of the frame length information generator 309 is supplied directly to the frame header composer 308 and that output of the header information error detection and error correction encoder 306a is branched to two directions and one branched output is supplied to the one-frame delay circuit 307 and the other branched output is supplied to the frame header composer 308.

Figure 29:
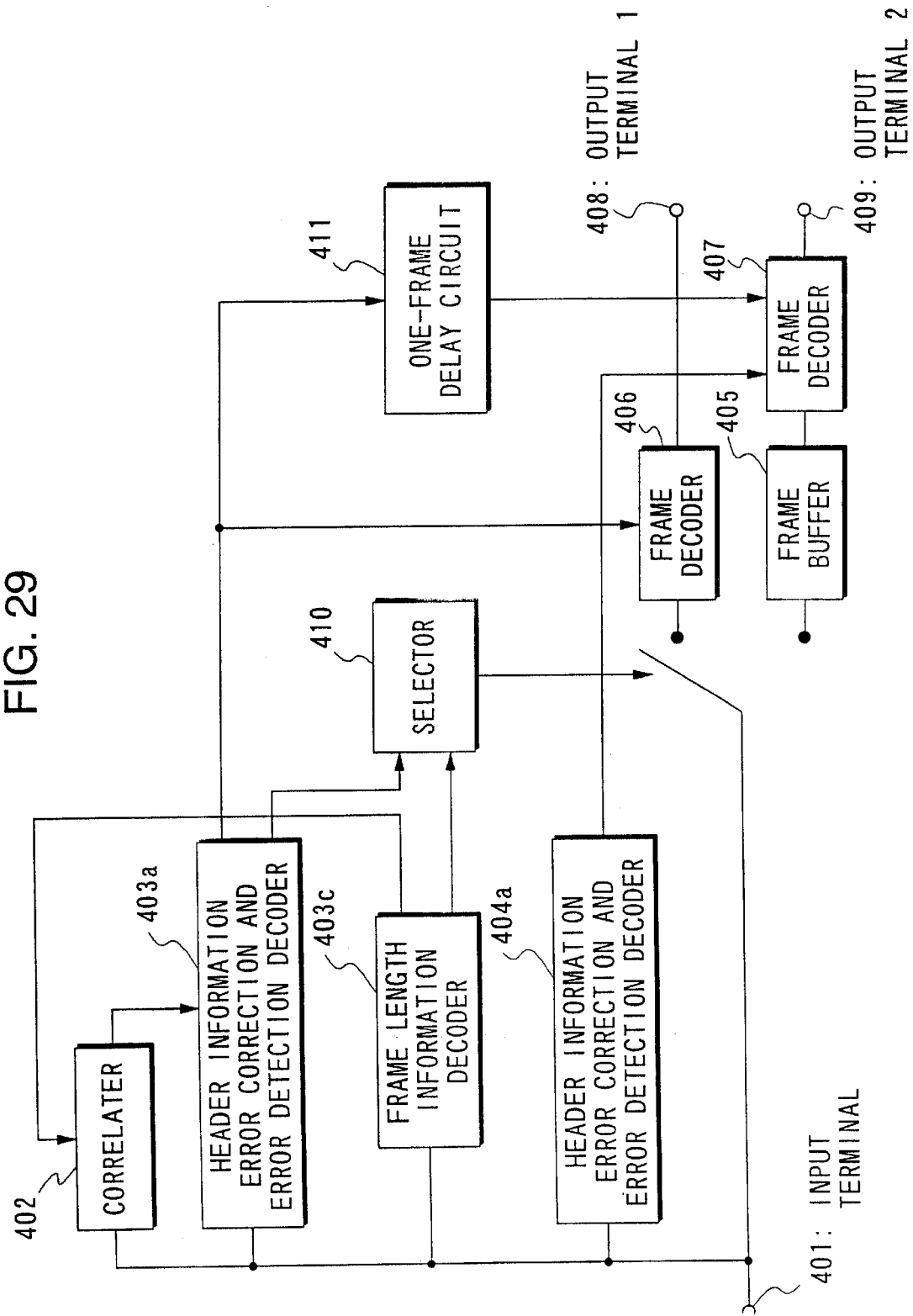
FIG. 29 is a block diagram showing the composition of an information data decoder in the variation example.

FIG. 29 is a block diagram showing the composition of an information data decoder in the same variation example, and this composition is different from the composition shown in FIG. 23 in a fact that the header information error correction and error detection decoder 403a and the frame length information decoder 403c in the variation example 1 are provided in place of the header information and frame length information error correction and error detection decoder 403. Since a connection relation among the header information error correction and error detection decoder 403a, the frame length information decoder 403c and their surrounding components is the same as the connection relation in the variation example 4, description of it is omitted.

C. Supplement to the Whole

Figure 32:
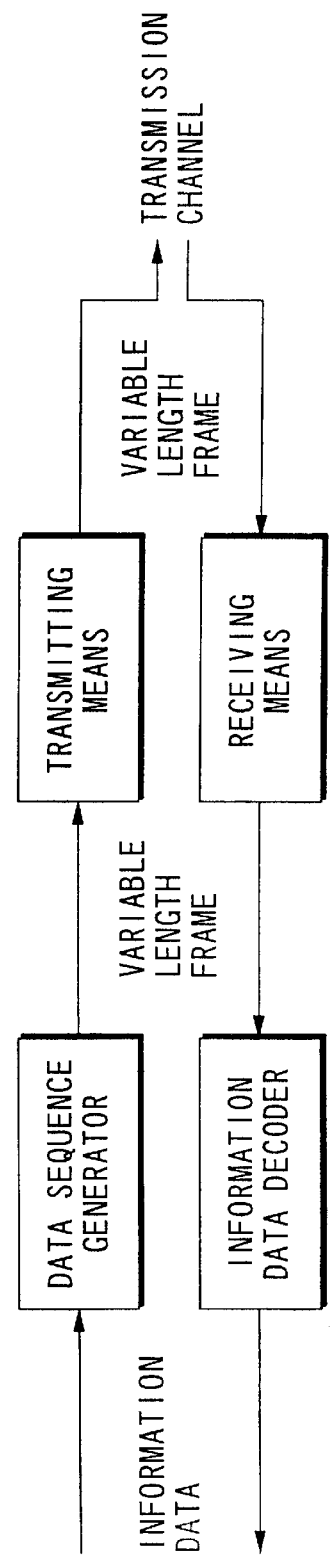
FIG. 32 is a block diagram showing the composition of a transmitter-receiver formed by combining the same transmitter and the same receiver.

In the above-mentioned embodiments, the examples of building a variable length data transmission system out of a transmitter having a data sequence generator and a receiver having an information data decoder have been shown, but without limiting to such examples a variable length data transmission system may be composed so as to use a transmitter-receiver having a data sequence generator and an information data decoder in either or each of the transmitter side and the receiver side. As shown in FIG. 32, this transmitter-receiver is provided with a data sequence generator for generating a variable length frame according to information data inputted from the outside, a transmitting means for transmitting a variable length frame generated by the data sequence generator to a transmission channel, a receiving means for receiving a variable length frame transmitted through the transmission channel, and an information data decoder for decoding information data contained in a variable length frame received by the receiving means. And in the embodiments, two pieces of header information in a frame structure shown in each of FIGS. 6 and 14 are used as header information for the same frame, but it is a matter of course that the invention is not limited to this.

Moreover, the number of pieces of header information to be disposed on a data sequence (signal sequence) for one frame (a piece of information data) needs to be plural but is not limited to "two". And in the above-mentioned embodiments, in case of arranging header information for one frame in different frames, header information n−1 is disposed in a frame n, but the invention is not limited to this and for example, header information n+1 or header information n−2 may be disposed there.

And an algorithm for error detection and error correction can be optionally selected, and the present invention is not to a specific algorithm. Moreover, a transmission channel of a data sequence may be either wire or wireless. And the transmission method of a data sequence may be either a serial transmission method or a parallel transmission method.

Furthermore, in the above-mentioned embodiments and variation examples, the position where header information not to be used for establishing a frame synchronization is disposed is "directly after frame length information" or "at the end of a frame", but the present invention is not limited to these and it may be a position which can be determined when a frame synchronization has been established. Therefore, the invention includes also an embodiment in which one piece of header information not to be used for establishing a frame synchronization is arranged over plural frames. Of course, since when plural pieces of header information for one piece of information data are close to one another on a data sequence the possibility that the plural pieces of header information cannot be decoded at all due to a burst error becomes high, it is preferable that the plural pieces of header information are arranged at positions sufficiently distant from one another in consideration of the transmission rate of a transmission channel of the data sequence and an environment of the transmission channel.

And the present invention is not limited to the above-mentioned embodiments and variation examples. For example, the invention can be applied to such a system other than a transmission system as a system which records a data sequence generated by a data sequence generator on a recording medium (for example, a floppy disk, a hard disk, an MO, a CD-R, a DVD, a RAM, an EPROM or the like) through a transmission channel such as a bus or the like, a system in which an information data decoder decodes information data from a data sequence read out from a recording medium (for example, a floppy disk, a hard disk, an MO, a CD-R, a CD-ROM, a DVD, a RAM, an EPROM, a ROM or the like) through a transmission channel such as a bus or the like, and the like.

What is claimed:

1. A data sequence generator for generating a data sequence to be transmitted through a transmission channel by generating according to input of information data a variable length frame having a first storage area storing variable length information data inputted from the outside, a second storage area storing specific information for establishing a frame synchronization, a third storage area storing header information necessary for decoding said information data and establishing said frame synchronization and a fourth storage area storing frame length information indicating a frame length, said data sequence generator comprising;
- a header information error detection encoding means for obtaining header information error-detection-encoded data by applying an error detection encoding process to said header information,
- a header information storing means for storing said header information error-detection-encoded data into said third storage area corresponding to said header information, and
- an inserting means for inserting said header information error-detection-encoded data in an insertion position which is a position to be determined from the timing of said frame synchronization in said data sequence and is separated from said third storage area.

2. A data sequence generator according to claim 1, comprising;
- a frame length information error detection encoding means for obtaining frame length information error-detection-encoded data by applying an error detection encoding process to said frame length information, and
- a frame length information storing means for storing said frame length information error-detection-encoded data into said fourth storage area corresponding to said frame length information.

3. A data sequence generator according to one of claims 1 and 2, wherein;
- said third storage area and said insertion position corresponding to said one piece of information data exist in said variable length frames different from each other.

4. A data sequence generator according to one of claims 1 and 2, comprising a header information error correction encoding means for obtaining header information error detection and error correction data by applying an error correction encoding process to said header information error-detection-encoded data obtained by said header information error detection encoding means, wherein;
- said header information storing means uses said header information error-detection- and error-correction-encoded data instead of said header information error-detection-encoded data.

5. A data sequence generator according to claim 4, wherein;
- said inserting means uses said header information error-detection-and error-correction-encoded data instead of said header information error-detection-encoded data.

6. A data sequence generator according to claim 4, comprising a frame length information error correction encoding means for obtaining frame length information error-detection- and error-correction-encoded data by applying an error correction encoding process to frame length information error-detection-encoded data obtained by said frame length information error detection encoding means, wherein;
- said frame length information storing means uses said frame length information error-detection- and error-correction-encoded data instead of said frame length information error-detection-encoded data.

7. A data sequence generator according to claim 6, wherein;
- said inserting means uses said header information error-detection- and error-correction-encoded data instead of said header information error-detection-encoded data.

8. A transmitter comprising;
- a data sequence generator for generating, a data sequence to be transmitted through a transmission channel by generating according to input of information data a variable length frame having a first storage area storing variable length information data inputted from the outside, a second storage area storing specific information for establishing a frame synchronization, a third storage area storing header information necessary for decoding said information data and establishing said frame synchronization and a fourth storage area storing frame length information indicating a frame length, said data sequence generator comprising:
  - a header information error detection encoding means for obtaining header information error-detection-encoded data by applying an error detection encoding process to said header information.
  - a header information storing means for storing, said header information error-detection-encoded data into said third storage area corresponding to said header information, and
  - an inserting means for inserting said header information error-detection-encoded data in an insertion position which is a position to be determined from the timing of said frame synchronization in said data sequence and is separated from said third storage area; and
- a transmitting means for sending out said data sequence generated by said data sequence generator to said transmission channel.

9. An information data decoder for decoding information data from a data sequence, said data sequence comprises a variable length frame having a first storage area for storing information data a second storage area for storing specific information for establishing a frame synchronization, a third storage area for storing header information necessary for decoding said information data and establishing said frame synchronization and a fourth storage area for storing frame length information indicating a frame length, comprising;
- a first header information error detection decoding means for performing an error detection decoding process on data stored in said third storage area of said variable length frame being under decoding and for outputting a first error detection result and a first decoding result,
- an insertion position determining means for determining said insertion position corresponding to said information data stored in said first storage area in said variable length frame on the basis of the timing of said frame synchronization of said variable length frame,
- a second header information error detection decoding means for performing an error detection decoding process on data inserted in said insertion position and outputting a second error defection result and a second decoding result,
- a header information selecting means for selecting one decoding result containing no error out of said first decoding result and said second decoding result on the basis of at least one of said first error detection result and said second error detection result, and
- an information data decoding means for decoding said information data using a decoding result selected by said header information selecting means.

10. An information data decoder according to claim 9, comprising;
- a frame length information error detection decoding means for performing an error detection decoding process on data stored in said fourth storage area of a variable length frame being under decoding and for outputting a third error detection result and a third decoding result, a synchronization timing directly determining means for determining the timing of said frame synchronization on the basis of said third decoding result, a synchronization timing serially determining means for determining the timing of said frame synchronization by detecting data stored in said second storage area and data stored in said third storage area following after said second storage area, and a synchronization timing selecting means for selecting either of the timing of said frame synchronization determined by said synchronization timing directly determining means and the timing of said frame synchronization determined by said synchronization timing serially determining means on the basis of said third detection result; wherein said insertion position determining means determines said insertion position corresponding to said information data stored in said first storage area in said variable length frame on the basis of said timing of said frame synchronization selected by said synchronization timing selecting means.

11. An information data decoder according to claim 9, comprising a first header information error correction decoding means for performing an error correction decoding process on data stored in said third storage area of said variable length frame being under decoding and for outputting a fourth decoding result, wherein;

said first header information error detection decoding means applies an error detection decoding process to said fourth decoding result.

12. An information data decoder according to claim 11, comprising a second header information error correction decoding means for performing an error correction decoding process on data inserted in said insertion position corresponding to said information data in said variable length frame being under decoding and for outputting a fifth decoding result, wherein;

said second header information error detection decoding means applies an error detection decoding process to said fifth decoding result.

13. An information data decoder according to claim 11, comprising a frame length information error correction decoding means for performing an error correction decoding process on data stored in said fourth storage area of said variable length frame being under decoding and for outputting a sixth decoding result, wherein;

said frame length information error detection decoding means applies an error detection decoding process to said sixth decoding result.

14. An information data decoder according to claim 12, comprising a frame length information error correction decoding means for performing an error correction decoding process on data stored in said fourth storage area of said variable length frame being under decoding and for outputting a sixth decoding result, wherein;

said frame length information error detection decoding means applies an error detection decoding process to said sixth decoding result.

15. A receiver comprising;

an information data decoder for decoding information data from a data sequence, said data sequence comprises a variable length frame having a first storage area for storing variable length information data, a second storage area for storing specific information for establishing a frame synchronization, a third storage area for storing header information necessary for decoding said information data and establishing said frame synchronization and a fourth storage area for storing frame length information indicating a frame length, comprising;

a first header information error detection decoding means for performing an error detection decoding process on data stored in said third storage area of said variable length frame being under decoding and for outputting a first error detection result and a first decoding result, an insertion position determining means for determining said insertion position corresponding to said information data stored in said first storage area in said variable length frame on the basis of the timing of said frame synchronization of said variable length frame, a second header information error detection decoding means for performing an error detection decoding process on data inserted in said insertion position and outputting a second error detection result and a second decoding result, a header information selecting means for selecting one decoding result containing no error out of said first decoding result and said second decoding result on the basis of at least one of said first error detection result and said second error detection result, and an information data decoding means for decoding said information data using a decoding result selected by said header information selecting means; and a receiving means for receiving said data sequence transmitted through said transmission channel.

16. A transmitter-receiver comprising;

a data sequence generator for generating a data sequence to be transmitted through a transmission channel by generating according to input of information data a variable length frame having a first storage area storing variable length information data inputted from the outside, a second storage area storing specific information for establishing a frame synchronization, a third storage area storing header information necessary for decoding said information data and establishing said frame synchronization and a fourth storage area storing frame length information indicating a frame length, said data sequence generator comprising;

a header information error detection encoding means for obtaining header information error-detection-encoded data by applying an error detection encoding process to said header information, a header information storing means for storing said header information error-detection-encoded data into said third storage area corresponding to said header information, and an inserting means for inserting said header information error-detection-encoded data in an insertion position which is a position to be determined from the timing of said frame synchronization in said data sequence and is separated from said third storage area;

a transmitting means for sending out said data sequence generated by said data sequence generator to said transmission channel, an information data decoder for decoding information data from a data sequence, said data sequence comprises a variable length frame having a first storage area for storing variable length information data, a second storage area for storing specific information for establishing a frame synchronization, a third storage area for storing header information necessary for decoding said information data and establishing said frame synchronization and a fourth storage area for storing frame length information indicating a frame length, comprising;

a first header information error detection decoding means for performing an error detection decoding process on data stored in said third storage area of said variable length frame being under decoding and for outputting a first error detection result and a first decoding a result, an insertion position determining means for determining said insertion position corresponding to said information data stored in said first storage area in said variable length frame on the basis of the timing of said frame synchronization of said variable length frame, a second header information error detection decoding means for performing an error detection decoding process on data inserted in said insertion position and outputting a second error detection result and a second decoding result, a header information selecting means for selecting one decoding result containing no error out of said first decoding result and said second decoding result on the basis of at least one of said first error detection result and said second error detection result, and an information data decoding means for decoding said information data using a decoding result selected by said header information selecting means, and a receiving means for receiving said data sequence transmitted through said transmission channel.

17. A transmitter-receiver comprising;

a data sequence generator for generating a data sequence to be transmitted through a transmission channel by generating according to input of information data a variable length frame having a first storage area storing variable length information data inputted from the outside, a second storage area storing specific information for establishing a frame synchronization, a third storage area storing header information necessary for decoding said information data and establishing said frame synchronization and a fourth storage area storing frame length information indicating a frame length, said data sequence generator comprising:

a header information error detection encoding means for obtaining header information error-detection-encoded data by applying an error detection encoding process to said header information, a header information storing means for storing said header information error-detection-encoded data into said third storage area corresponding to said header information, and an inserting means for inserting said header information error-detection-encoded data in an insertion position which is a position to be determined from the timing of said frame synchronization in said data sequence and is separated from said third storage area, a frame length information error detection encoding means for obtaining frame length information error-detection-encoded data by applying an error detection encoding process to said frame length information, and a frame length information storing means for storing said frame length information error-detection-encoded data into said fourth storage area corresponding to said frame length information, a transmitting means for sending out said data sequence generated by said data sequence generator to said transmission channel, an information data decoder for decoding information data from a data sequence, said data sequence comprises a variable length frame having a first storage area for storing variable length information data, a second storage area for storing specific information for establishing a frame synchronization, a third storage area for storing header information necessary for decoding said information data and establishing said frame synchronization and a fourth storage area for stoning frame length information indicating a frame length, comprising;

a first header information error detection decoding means for performing an error detection decoding process on data stored in said third storage area of said variable length frame being under decoding and for outputting a first error detection result and a first decoding result, an insertion position determining means for determining said insertion position corresponding to said information data stored in said first storage area in said variable length frame on the basis of the timing of said frame synchronization of said variable length frame, a second header information error detection decoding means for performing an error detection decoding process on data inserted in said insertion position and outputting a second error detection result and a second decoding result, a header information selecting means for selecting one decoding result containing no error out of said first decoding result and said second decoding result on the basis of at least one of said first error detection result and said second error detection result, an information data decoding means for decoding said information data using a decoding result selected by said header information selecting means, a frame length information error detection decoding means for performing an error detection decoding process on data stored in said fourth storage area of a variable length frame being under decoding and for outputting a third error detection result and a third decoding result, a synchronization timing directly determining means for determining the timing of said frame synchronization on the basis of said third decoding result, a synchronization timing serially determining means for determining the timing of said frame synchronization by detecting data stored in said second storage area and data stored in said third storage area following after said second storage area, and a synchronization timing selecting means for selecting either of the timing of said frame synchronization determined by said synchronization timing directly determining means and the timing of said frame synchronization determined by said synchronization timing serially determining means on the basis of said third detection result; wherein said insertion position determining means determines said insertion position corresponding to said information data stored in said first storage area in said variable length frame on the basis of said timing of said frame synchronization selected by said synchronization timing selecting means; and a receiving means for receiving said data sequence transmitted through said transmission channel.

18. A data sequence generating method for generating a data sequence composed of a variable length frame having a first storage area storing variable length information data, a second storage area storing specific information for establishing a frame synchronization, a third storage area storing header information necessary for decoding said information data and establishing the frame synchronization, and a fourth storage area storing frame length information indicating a frame length, said data sequence generating method performing for every at least one piece of said information data;

a storing step of error-detection-encoding said header information corresponding to said information data and storing the encoded information into said third storage area corresponding to said information data, and an inserting step of error-detection-encoding said header information and inserting the encoded information in a position which is a position to be determined from the timing of said frame synchronization in said data sequence and is separated from said storage area.

19. An information data decoding method for decoding information data from a data sequence composed of a variable length frame having a first storage area storing variable length information data, a second storage area storing specific information for establishing a frame synchronization, a third storage area storing header information necessary for decoding said information data and establishing the frame synchronization, and a fourth storage area storing frame length information indicating a frame length, said information data decoding method performing for every at least one frame of said variable length frames;

a first error detection step of error-detection-decoding data stored in said third storage area of said variable length frame being under decoding, a second error detection step of error-detection-decoding data inserted in a position determined from the timing of said frame synchronization, and a decoding step of decoding said information data stored in said first storage area of said variable length frame, using one decoding result containing no error out of the decoding result in said first error detection step and the decoding result in said second error detection step.

20. A transmitter comprising:

a data sequence generator for generating a data sequence to be transmitted through a transmission channel by generating according to input of information data a variable length frame having a first storage area storing variable length information data inputted from the outside, a second storage area storing specific information for establishing a frame synchronization, a third storage area storing header information necessary for decoding said information data and establishing said frame synchronization and a fourth storage area storing frame length information indicating a frame length, said data sequence generator comprising;

a header information error detection encoding means for obtaining header information error-detection-encoded data by applying an error detection encoding process to said header information, a header information storing means for storing said header information error-detection-encoded data into said third storage area corresponding to said header information, and an inserting means for inserting said header information error-detection-encoded data in an insertion position which is a position to be determined from the timing of said frame synchronization in said data sequence and is separated from said third storage area, a frame length information error detection encoding means for obtaining frame length information error-detection-encoded data by applying an error detection encoding process to said frame length information, and a frame length information storing means for storing said frame length information error-detection-encoded data into said fourth storage area corresponding to said frame length information; and a transmitting means for sending out said data sequence generated by said data sequence generator to said transmission channel.

21. A receiver comprising;

an information data decoder for decoding information data from a data sequence, said data sequence comprises a variable length frame having a first storage area for storing variable length information data, a second storage area for storing specific information for establishing a frame synchronization, a third storage area for storing header information necessary for decoding said information data and establishing said frame synchronization and a fourth storage area for storing frame length information indicating a frame length, comprising:

a first header information error detection decoding means for performing an error detection decoding process on data stored in said third storage area of said variable length frame being under decoding and for outputting a first error detection result and a first decoding result, an insertion position determining means for determining said insertion position corresponding to said information data stored in said first storage area in said variable length frame on the basis of the timing of said frame synchronization of said variable length frame, a second header information error detection decoding means for performing an error detection decoding process on data inserted in said insertion position and outputting a second error detection result and a second decoding result, a header information selecting means for selecting one decoding result containing no error out of said first decoding result and said second decoding result on the basis of at least one of said first error detection result and said second error detection result, an information data decoding means for decoding said information data using a decoding result selected by said header information selecting means, a frame length information error detection decoding means for performing an error detection decoding process on data stored in said fourth storage area of a variable length frame being under decoding and for outputting a third error detection result and a third decoding result, a synchronization timing directly determining means for determining the timing of said frame synchronization on the basis of said third decoding result, a synchronization timing serially determining means for determining the timing of said frame synchronization by detecting data stored in said second storage area and data stored in said third storage area following after said second storage area, and a synchronization timing selecting means for selecting either of the timing of said frame synchronization determined by said synchronization timing directly determining means and the timing of said frame synchronization determined by said synchronization timing serially determining means on the basis of said third detection result; wherein said insertion position determining means determines said insertion position corresponding to said information data stored in said first storage area in said variable length frame on the basis of said timing of said frame synchronization selected by said synchronization timing selecting means; and a receiving means for receiving said data sequence transmitted through said transmission channel.

22. An information data decoder according to claim 10, comprising a first header information error correction decoding means for performing an error correction decoding process on data stored in said third storage area of said variable length frame being under decoding and for outputting a fourth decoding result, wherein;

said first header information error detection decoding means applies an error detection decoding process to said fourth decoding result.

23. An information data decoder according to claim 22, comprising a second header information error correction decoding means for performing an error correction decoding process on data inserted in said insertion position corresponding to said information data in said variable length frame being under decoding and for outputting a fifth decoding result, wherein;

said second header information error detection decoding means applies an error detection decoding process to said fifth decoding result.

24. An information data decoder according to claim 22, comprising a frame length information error correction decoding means for performing an error correction decoding process on data stored in said fourth storage area of said variable length frame being under decoding and for outputting a sixth decoding result, wherein;

said frame length information error detection decoding means applies an error detection decoding process to said sixth decoding result.

25. An information data decoder according to claim 23, comprising a frame length information error correction decoding means for performing an error correction decoding process on data stored in said fourth storage area of said variable length frame being under decoding and for outputting a sixth decoding result, wherein;

said frame length information error detection decoding means applies an error detection decoding process to said sixth decoding result.

* * * * *